United States Patent [19]
Eshelman et al.

[11] Patent Number: 5,390,283
[45] Date of Patent: Feb. 14, 1995

[54] METHOD FOR OPTIMIZING THE CONFIGURATION OF A PICK AND PLACE MACHINE

[75] Inventors: Larry J. Eshelman, Ossining; James D. Schaffer, Wappingers Falls, both of N.Y.

[73] Assignee: North American Philips Corporation, New York, N.Y.

[21] Appl. No.: 965,474

[22] Filed: Oct. 23, 1992

[51] Int. Cl.6 .............................................. G06F 15/18
[52] U.S. Cl. ......................................... 395/13; 395/21
[58] Field of Search ..................... 395/13, 21; 364/468, 364/482, 402

[56] References Cited
U.S. PATENT DOCUMENTS

| | | | |
|---|---|---|---|
| 4,630,219 | 12/1986 | DiGiacomo et al. | 364/488 |
| 4,638,442 | 1/1987 | Bryant et al. | 364/489 |
| 4,697,242 | 9/1987 | Holland et al. | 395/13 |
| 4,935,877 | 6/1990 | Koza | 395/13 |
| 5,255,345 | 10/1993 | Shaefer | 395/13 |

OTHER PUBLICATIONS

Task scheduling for flexible manufacturing systems based on genetic algorithm Edwin S. H. Hou et al. 13–16 Oct. 1991.
Use of genetic algorithm for economic optimization of a manufacturing system. R. F. Tenga Apr. 18, 1988.
PA 1004, MCM 8, Philips. Mar. 6, 1992.
L. J. Eshelman, "The CHC Adaptive Search Algorithm: How to Have Safe Search When Engaging in Nontraditional Genetic Recombination", Foundations of Genetic Algorithms & Classifier Systems, Calif., 1991 (Philips TR-90-006).

*Primary Examiner*—Allen R. MacDonald
*Assistant Examiner*—Richmond Dorvil
*Attorney, Agent, or Firm*—Anne E. Barschall

[57] ABSTRACT

A genetic algorithm is used to search for optimal configurations of a computer controlled pick and place machine, which places parts on printed circuit boards. Configurations include: assigning grippers to pipettes of the machine; assigning parts, destined for the printed circuit boards, to feeders of the machine; assigning parts to pipettes; and determining time intervals and orders in which parts are to be placed. The genetic algorithm is applied to chromosome strings representing parameters for determining machine configuration. A heuristic layout generator generates machine configurations from the chromosome strings.

21 Claims, 9 Drawing Sheets

METHOD FOR OPTIMIZING THE CONFIGURATION OF A PICK AND PLACE MACHINE

This invention relates to a method for configuring a component placement machine to improve performance.

BACKGROUND OF THE INVENTION

Electronic component placement machines, sometimes called pick-and-place machines, are known. They are typically used to load chip components onto a printed circuit board (PCB) for subsequent processing, such as by soldering the components to the PCB traces.

The typical machine comprises a platform for supporting the PCB—usually supplied on a conveyor—adjacent to which are provided a plurality of component parts feeders. The components typically are provided on reels of tape supplied to the feeders or as stick or bulk feeders. A head movable in the X-Y plane, parallel to the PCB, and along the Z-axis, up and down with respect to the PCB, has at its bottom one or more parts holders which include pipettes, because the holding power is provided by computer-controlled suction. Attached to an active pipette is a gripper. Grippers are typically selective, only able to pick up certain sized parts.

To improve production throughput, it is desirable to reduce the time to load or populate the PCB. When the machine uses a single head with a single pipette, the problem reduces to locating the parts around the platform to minimize the distance the head has to move to pick up a part from a feeder and place it on its correct site on the PCB under computer control. Even though only one part at a time is picked and placed, providing an optimal or near-optimal parts layout— known as configuring the machine—can be difficult, but is usually done by hand or by relatively simple conventional programs.

However, newer machines available on the market use multiple pipettes so that plural parts can be picked and place during each head movement. The problem then becomes assigning parts to the appropriate feeders, and grippers to pipettes, and one or more head-routing problems such as to minimize the time needed to populate the PCB. We refer to the assignment of parts to feeders and grippers to pipettes as a "layout" and the "charge map" as the specification of a control program for the machine. The combinatorial difficulties of this problem will be evident especially considering that a modern machine may have 28 pipettes, 112 bins or parts feeders, and a plurality of grippers capable of handling parts varying in size from 8–44 mm. In addition, other constraints on the machine configuration have to be taken into account, such as larger parts may require an additional alignment step, large parts in one bin feeder may shadow adjacent bin feeders which thus cannot be used, etc.

Manual solutions, on a trial and error basis, normally are used to establish a machine configuration for each new PCB layout. This is time consuming, and it is difficult to judge whether the configuration chosen is optimal. Some limited computer assistance is available for some machines. To our knowledge, no one has been able to develop a good computer-controlled algorithm capable of providing a near-optimal configuration for such a kind of placement machine employing multiple pipettes.

SUMMARY OF THE INVENTION

The chief object of the invention is a method based on a computer-controlled algorithm that is able to produce high-quality configurations for arbitrary tasks for machines of the type described.

In accordance with one aspect of our invention, we have discovered that a class of algorithms known as genetic algorithms are capable of providing near-optimal solutions to the machine configuration problem for such machines employing plural grippers, and plural parts feeders.

In accordance with another aspect of our invention, we have further discovered that additional improvements can be obtained in using genetic algorithms by restricting the genetic algorithms to those employing specific techniques not commonly employed with such algorithms. In particular, we prefer to employ genetic algorithms eliminating incestuous matings between parent chromosome strings, applying a particularly vigorous form of crossover to pairs of parent strings to create new offspring, employing survival of the fittest involving both parent and child chromosome strings, and applying population mutation only when the generated solutions converge after a limited number of iterations.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention.

DETAILED DESCRIPTION OF THE PREFERRED EMBODIMENTS

Figure 1A:
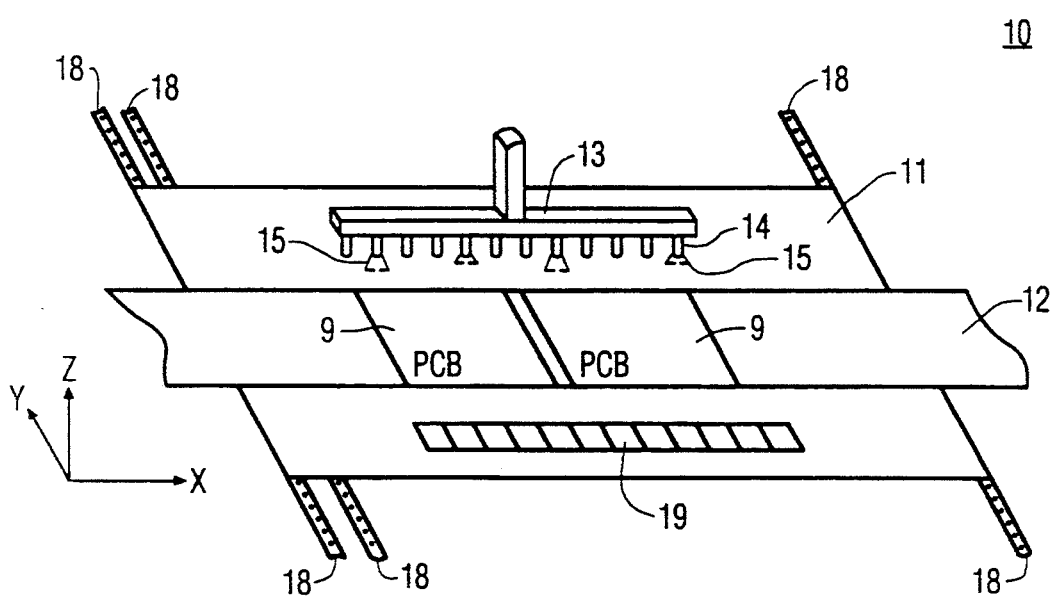
FIG. 1A is a perspective and FIG. 1B a schematic view from the top of a model MCM parts placement machine of the type for which the method of the invention is suitable.

The method of the invention is generally applicable to any placement machine having a plurality of part-grasping devices on one or more heads movable in three dimensions sequentially but usually simultaneously picking up parts fed from a plurality of feeders and placing them on one or more boards under computer control. As the number of part-grasping devices increases, the complexity of providing a good machine configuration increases. In general, the method of the invention will be needed—prove faster or superior to a manual approach—with a class of machines whose number of part-grasping devices exceeds three. The invention will be explained in its application to providing high-quality configurations for two commercial placement machines in this class, but it will be understood that the invention is not limited to such machines but will be generally applicable to any machines in the class as defined, and those skilled in the art will be able to apply the principles as described herein to other machines in this class. The two machines for which detailed explanations will be given are Philips Modular Component Placement Machines, Models MCM-VII and FCM.

The Philips MCM-VII Modular Component Placement Machine is a machine for surface-mount assembly of surface-mounted electronic devices. These machines are distinguished by having a number of part-grasping pipettes for simultaneously picking up parts and placing them on one or more circuit boards. In particular, the MCM-VII has 28 pipettes mounted on a movable head which all move as a unit. They can simultaneously grip up to 28 parts from a set of feeders and then place the parts on circuit boards. At the center of the machine is a conveyer which moves the circuit boards into position. On each side of the conveyor is a row of slots (feeders) where parts magazines (tapes) are placed. There are a maximum of 56 bins on each side (28 * 2). "Maximum" because the width of each feeder varies (for different sized parts), but the total slot spacing is fixed. (The maximum number of bins may be used only if all parts are small.) Parts magazines come in a small number of standard widths: 8, 12, 16, 24, 36 and 44 millimeters. There is a large number of different parts available which fall into part-type families grouped by the type of gripper they fit. A gripper is a small fixture that is mounted on a pipette. Thus, once a particular gripper type is attached to a pipette, it can pick up and place only parts of the appropriate type.

The 28 pipettes are evenly spaced in a single row along the X-axis of the head. They can only move in the Z direction (up and down). The head can move in both the X and Y directions. The placement of the parts may either take place sequentially or simultaneously. Simultaneous placement, when multiple grippers are mounted in a single head, requires that there be more than one circuit board on the circuit carrier. For example, if there are two circuit boards, then there is the potential for pair-wise simultaneous placement of parts.

The grippers for picking up the smaller part sizes (8 and 12 mm) simultaneously align the parts. An extra step must be taken, on the other hand, to align the large parts. On each side of the conveyor are 14 alignment nests for aligning the large parts. These alignment nests are spaced so that either all the large parts gripped by the even or the odd numbered pipettes can be aligned simultaneously.

Figure 1B:
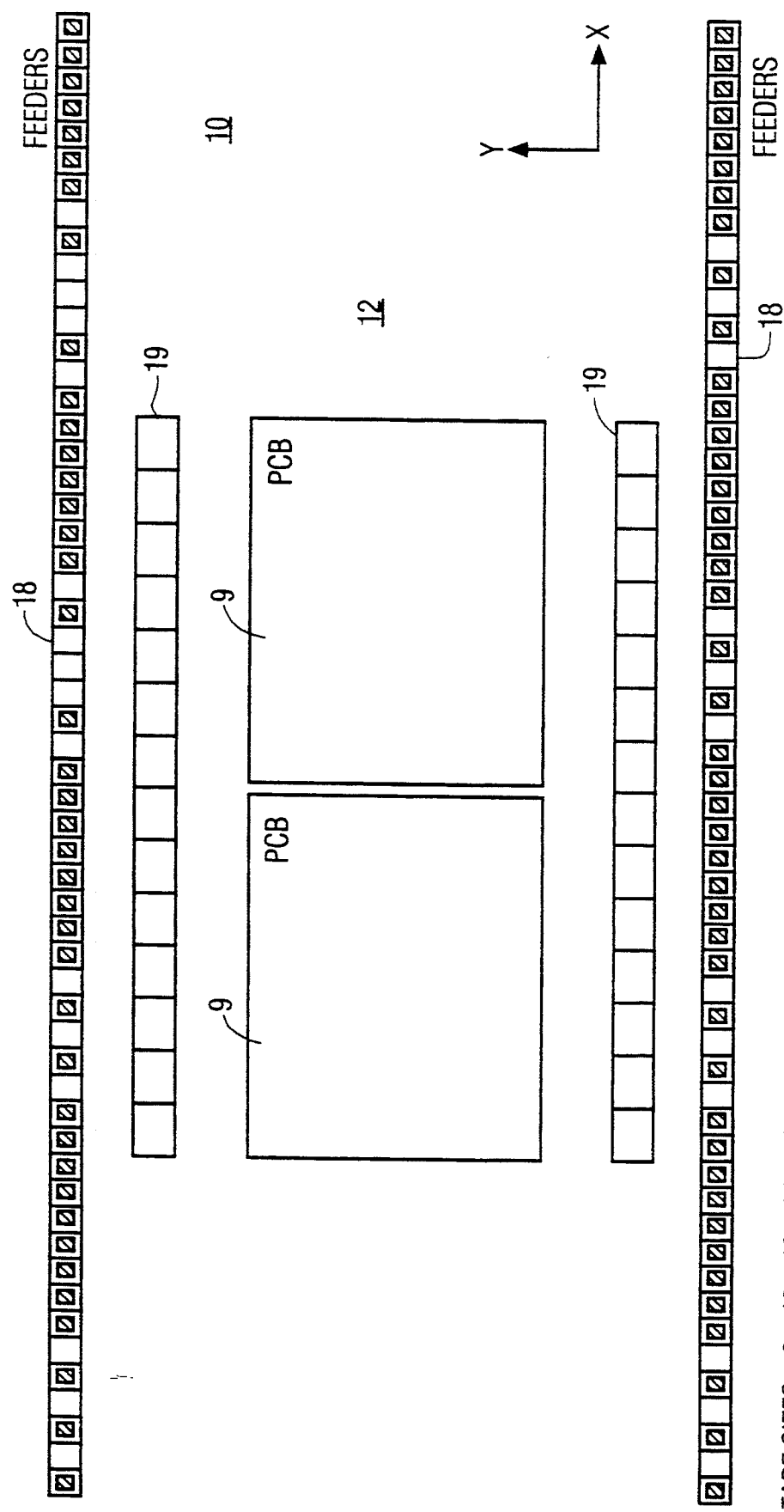

FIG. 1A is a schematic perspective and FIG. 1B a schematic view from the top of the MCM machine 10, which comprises a machine base 11 for supporting at the center the PCB conveyor 12 with two PCBs 9 as shown. The head is shown at 13, with the pipettes 14 (only 12 are shown for simplicity) descending from the head. Grippers 15 of different sizes are shown on some of the pipettes 14. The computer control and the suction apparatus are not shown. The bins 18 are shown schematically arranged at opposite sides of the conveyor 12 (only 6 are shown for simplicity). Alignment nests 19 are shown at several locations. The X, Y, and Z directions are indicated by the arrows at the corner of the figure.

The configuration problem for a class of machines which includes the MCM can be briefly stated as follows:

Given one or more circuit boards with their attendant list of parts (specifying the width, the gripper type and x-y coordinates for each), the task is to assign the parts to bins and grippers to pipettes and to specify which parts are picked and placed together so that all the parts can be placed on the boards in minimum time. The time required to place the parts depends mainly upon three factors: the number of times that the head has to (simultaneously) pick up parts, the number of times that the head has to visit the alignment nests, and the number of times the head has to move to place the parts. If there is a single board, the latter factor is constant (equal to the total number of parts), but if there are several boards, then this factor can be reduced via simultaneous placements.

A solution to a configuration problem is called a charge-map. A charge is one pick-and-place cycle with the specific parts named. A charge-map, then, is a list of specific charges which will completely populate the boards. To create a charge-map, gripper types must be assigned to pipettes and parts to bins and all the parts must be grouped into charges.

There are a number of constraints that must be met in order for a charge-map to be valid. First, the assignment of a large part to a bin will prevent neighboring bins from being used—this effect is called shadowing. Secondly, the correct gripper type must be used to pick up a component—thus, pipettes can be used to pick up parts only from certain bins. Finally, not all pipettes can reach every potential board location, so reachability must be taken into account when determining which pipettes to use to place particular parts.

As an introduction for the detailed description that will follow, the invention is a method for generating near-optimal charge-maps for the placement machine, given a list of parts to be placed. The method is embodied in computer programs. A parts list specifies for each part to be placed: a) a unique part number, b) a part type, c) a gripper type, and d) its location (x and y coordinates in a coordinate system relative to the machine) and orientation for placement.

The invention comprises three major items: HLG: a heuristic layout (charge-map) generator; CHC: an adaptive search algorithm for searching the parameters that control HLG; and a heuristic preprocessor for determining the parameter ranges searched by CHC. CHC generates trial solutions in the form of parameter values, i.e., trial parameter sets, and HLG interprets or uses these trial solutions (for a given set of parts and placement coordinates) to generate charge-maps, returning to CHC a measure of each charge-map's merit (an estimate of the time it would take to execute the solution).

The heuristic charge-map generator (HLG) is an algorithm for solving configuration problems whose behavior can be altered by altering a set of input parameters. HLG takes a hierarchical approach to generating a charge-map. The core of the method is first to assign grippers to pipettes and determine which bins will be associated with which grippers. Then it assigns parts to the bins and determines how the parts are grouped into charges.

During the gripper assignment stage, HLG first chooses a gripper type by cycling through all the gripper types and assigning each gripper type a measure of desirability, picking the gripper with the highest degree of desirability. By "desirability" is meant a number representing the gripper's merit in its relation to the targeted slots. Then it cycles through the pipettes assigning each pipette a desirability for the chosen gripper type, assigning the gripper type to the pipette with the highest desirability. Then one or more of the four corresponding bins is allocated to the pipette.

During the part assignment stage, HLG first determines for each gripper type the number of tapes (parts magazines) for each of its component types so that the largest number of any parts in any tape is kept to a minimum. Next the tapes are assigned to bins, making sure that the component coordinates are reachable and with the goal of minimizing the number of charges and maximizing the number of multiplacements of parts.

Although in principle any algorithm which can generate new solutions (in the parameter solution space) for testing by HLG can be used in conjunction with HLG, in practice, the parameter search algorithm must not be easily trapped by local minima and it must be able to limit the search to the regions of the search space that are likely to contain plausible solutions. Genetic algorithms (GAs) (explained below) have both of these characteristics. In the configuration algorithm of the invention, a variant of the GA, CHC, is used as the parameter search algorithm.

The heuristic preprocessor examines the parts list and determines reasonable ranges for some of the parameters.

The application of the method of the invention to a problem consists of the following steps:

1. Create a machine readable file containing the parts list.

2. Run the preprocessor program which creates a machine readable file which determines the format of the HLG input parameter set.

3. Run the problem solver which includes CHC and HLG which work together to find charge-maps with low execution times. CHC treats parameter sets as chromosomes in a simulation of the evolutionary search for high performance sets. HLG serves as the evaluator of the "fitness" of each one.

The workings of CHC are described in detail in a paper published by one of the inventors herein (Eshelman) which appeared in Foundations of Genetic Algorithms, edited by Gregory Rawlins and published by Morgan Kaufmann, San Mateo, Calif. (1991). The paper was also presented at a meeting in Bloomington, IN, Jul. 15-18, 1990. The paper is entitled "The CHC Adaptive Search Algorithm: How to Have Safe Search When Engaging in Nontraditional Genetic Recombination", and the contents thereof are herein incorporated by reference.

As is well known by those skilled in this art, a genetic algorithm (GA) is a powerful general-purpose search method based on mechanisms abstracted from population genetics. The GA maintains a set of trial solutions called a population. It operates in cycles called generations that produce successive populations by survival-of-the-fittest selection followed by genetic recombination. Trial solutions are represented as strings called chromosomes that are usually coded with a binary character set. The theory underlying the GA does not guarantee the location of a global optimum, but only that near-optimal advantage will be taken of the information gleaned during search.

The Eshelman paper and references cited therein will provide to those skilled in this art a complete description of GAs generally. While GA as a class can be applied to the configuration problem, we have found that adding certain variations to the algorithm greatly improves its ability to provide a high-quality solution. This will be better understood from the following more detailed description.

The outline of a traditional GA appears below:

```
procedure GA
  begin
      t = 0;
      initialize P(t);
      evaluate structures in P(t);
      while termination condition not satisfied do
      begin
          t = t + 1
          select_m C(t) from P(t−1);
          recombine structures in C(t) to form C'(t);
          evaluate stuctures in C'(t);
          select_r P(t) from C'(t) and P(t−1);
      end
  end.
```

By a "traditional GA" is meant a GA for which the following is assumed: (1) The initialization of the population P(O) (of fixed size M) is random. (2) The selection for mating (select_m) is biased toward selecting the better performing structures. (3) The selection for replacement (select_r) is uniform (unbiased), typically replacing the entire old population P(t−1) with the children C(t) generated from P(t−1). (4) The recombination operator is either 1 or 2 point crossover. (5) A low rate of mutation is used in the recombination stage to maintain population diversity.

CHC differs from a traditional GA on all but the first of these points. First, it is driven by replacement selection rather than mating selection. In other words, the bias in favor of the better performing structures occurs in replacement selection rather than mating selection. Second, a new bias is introduced during mating selection against recombining individuals who are similar. Third, the recombination operator used by CHC, unlike 1 or 2 point crossover, is a highly disruptive form of crossover. Finally, mutation is not performed at the recombination stage. Rather, diversity is re-introduced by partial population randomization whenever convergence is detected.

With regard to the first item, elitist selection, CHC replaces "reproduction with emphasis" with "survival of the fittest". More precisely, during selection for reproduction, instead of biasing the selection of candidates C(t) for reproduction in favor of the better performing members of the parent population P(t−1), each member of P(t−1) is copied to C(t), and randomly paired for reproduction. (In other words, C(t) is identical to P(t−1) except that the order of the structures has been shuffled.) During survival-selection, on the other hand, instead of replacing the old parent population P(t−1) with the children population C(t) to form P(t), the newly created children must compete with the members of the parent population P(t−1) for survival—i.e., competition is cross-generational. More specifically, the members of P(t−1) and C'(t) are merged and ranked according to fitness, and P(t) is created by selecting the best M (where M is the population size) members of the merged population. (In cases where a member of P(t−1) and a member of C'(t) have the same fitness, the member of P(t−1) is ranked higher.) We shall call this procedure of retaining the best ranked members of the merged parent and child populations population-elitist selection since it guarantees that the best M individuals seen so far shall always survive.

With regard to the second item, avoiding incest, the exponential growth of instances of good schemata is of little value if it leads to premature convergence. It is preferred to crossover half the differing bits between the parents. One of the effects of this is that the danger of premature convergence is lessened. Even if at each generation the most recent descendant mates with one of its original ancestors (the same one each time), it will take $\log_2 h$ generations to converge (within one bit) to the original ancestor where h is the Hamming distance between the original parents. In the case of two-point crossover, on the other hand, each of the two children will differ from its nearest (measured by Hamming distance) parent by an amount ranging from one bit to no more than half the length of the string L. Thus, the longest time it can take to converge within one bit of its ancestor is $\log_2 h$ generations and the shortest is one generation. Of course, a child is unlikely to be repeatedly mated with one of its remote ancestors, but since better individuals have more descendants, it is fairly likely that an individual will be mated with one of its near relatives. In so far as this leads to crossing over of individuals that share a lot of alleles, exploration via recombination quickly degenerates. Although using a crossover operating that randomly crosses over half the differing bits (HUX, defined below) slows this process, sometimes individuals are paired that have few differences. If one or both children survive this mating, it will be even more likely that such an event will occur the next generation.

CHC has an additional mechanism to slow the pace of convergence—a mechanism for helping avoid incest. During the reproduction step, each member of the parent population is randomly chosen without replacement and paired for mating. Before mating, however, the Hamming distance between potential parents is calculated, and if half that distance (the Hamming distance of the expected children from their parents) does not exceed a difference threshold, they are not mated and are deleted from the child population. (The difference threshold is set at the beginning of the run to L/4—half the expected Hamming distance between two randomly generated strings.) Thus, typically only a fraction of the population is mated to produce new offspring in any generation. Whenever no children are accepted into the parent population (either because no potential mates were mated or because none of the children were better than the worst member of the parent population), the difference threshold is decremented. The effect of this mechanism is that only the more diverse potential parents are mated, but the diversity required by the difference threshold automatically decreases as the population naturally converges. The number of survivors for each generation stays remarkably constant throughout the search because when CHC is having difficulty making progress, the difference threshold drops faster than the average Hamming distance, so that more individuals are evaluated. Conversely, when CHC is finding it easy to generate children that survive, the difference threshold drops at a slower rate, and the number of matings falls.

With regard to the third item, uniform crossover, it is important to keep in mind that what we are looking for in a GA is an operator that provides productive recombinations and not simply preservation of schemata. There is a tradeoff between effective recombination and preservation. A recombination operator that always crossed over a single differing bit, for example, would create new individuals while being minimally disruptive, but it would not be a very useful operator. More generally, this tradeoff can be seen by examining the formula for the minimum number of schemata preserved via crossover (i.e., when the parents are complementary at all loci):

$$2^x + 2^{(L-x)} \qquad (1)$$

where L is the string length and x is the number of bits crossed over. Note that the number of schemata guaranteed to be preserved is greatest when the operator does no recombining, i.e., when x=0 or L. On the other hand, the number of schemata guaranteed to be preserved is the lowest when x=L/2. Thus, if we are mainly interested in preservation, we would prefer that x be low. But what if our concern is with recombination?

The intuitive idea behind recombination is that by combining features from two good parents we may produce even better children. What we want to do is copy high valued schemata from both parents, simultaneously instantiating them in the same child. Clearly the more bits that we copy from the first parent the more schemata we copy and thus the more likely we are to copy, without disruption, high valued schemata. On the other hand, the more bits we copy over from the first parent the fewer we can copy from the second parent, thus increasing the likelihood of disrupting high valued schemata from the second parent. Consequently, a crossover operator that crosses over half the bits (or even better, half the differing bits) will be most likely to combine valuable schemata simply for the reason that the maximum number of schemata is combined from each parent.

Uniform crossover, UX, exchanges bits rather than segments. The actual recombination operator used by CHC is HUX, a variant of uniform crossover, HUX crosses over exactly half the non-matching alleles, where the bits to be exchanged are chosen at random without replacement. HUX guarantees that the children are always the maximum Hamming distance from their two parents. The flip side of HUX's disruptiveness is that it maximizes the chance of two good schemata, one from each parent, being combined in a child since half the material from each parent is chosen. Furthermore, all schemata of the same order have an equal chance of being disrupted or preserved.

With regard to the final item, restarts, the use of HUX and incest prevention in conjunction with a population size large enough to preserve a number of diverse structures (e.g., 50) enables CHC to delay premature convergence and thus do quite well without any mutation. But these various mechanisms cannot guarantee that no locus will prematurely converge. Some sort of mutation is needed.

Mutation, however, is less effective in CHC than in the traditional GA. Since CHC is already very good at maintaining diversity, mutation contributes very little early on in the search. On the other hand, late in the search, when the population is nearly converged, mutation, combined with elitist selection, is not very effective in reintroducing diversity. At this stage of the search mutation will rarely produce an individual who is better than the worst individual in the population, and consequently very few individuals will be accepted into the population. In contrast to CHC, a traditional GA, by replacing the parent population each generation, insures that new variations will constantly be introduced.

CHC's way out of this impasse is to only introduce mutation whenever the population has converged or search has stagnated (i.e., the difference threshold has dropped to zero and there have been several generations without any survivors). More specifically, whenever the reproduction-recombination cycle achieves its termination condition, the population is re-initialized and the cycle is repeated. The re-initialization, however, is only partial. The population is re-initialized by using the best individual found so far as a template for creating a new population. Each new individual is created by flipping a fixed proportion (e.g., 35%) of the template's bits chosen at random without replacement. One instance of the best individual is added unchanged to the new population. This insures that the next search cannot converge to a worse solution than the previous search. This outer loop, consisting of re-initialization (or cataclysmic mutation) followed by genetic search, is iterated until its termination condition is met (either reaching a fixed number of re-initializations, or repeated failure to find any better structures than the retained structure).

Figure 2:
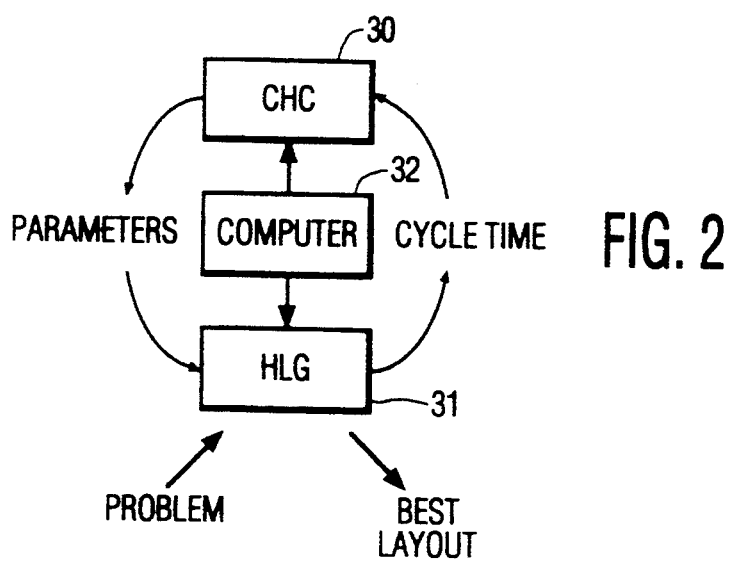
FIG. 2 is a data flow diagram of a system for carrying out the method of the invention.
Figure 3:
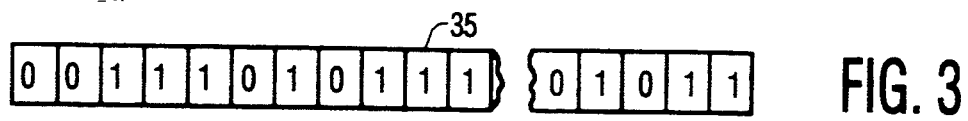
FIG. 3 is a schematic of one form of chromosome string useful in the method of the invention.

Some of the concepts above can be further explained with schematic diagrams. FIG. 2 is a data flow diagram illustrating the inventive method. The block 30 labeled CHC represents the program with the genetic algorithm of the invention, and the block 31 labeled HLG represents the program with the heuristic layout generator, both under the control of a computer 32. The problem is input to HLG 31, in the form of a parts list, specifying each part's coordinates on the PCB, along with each part's required gripper type and feeder type. The preprocessor part (explained below) of the HLG program is executed once at the beginning of the process, and creates, in machine readable form, a chromosome-profile representing the allowable parameter ranges. CHC generates an initial set (population) of chromosomes, each representing parameters that the HLG uses to determine a complete machine configuration. While the chromosome can take any form, for simplicity it is usually in the form of a bitstring of ones and zeros, shown schematically at 35 in FIG. 3. The bitstring 35 is made long enough so that sequential groups of bits can unambiguously be used by the HLG to generate a specific machine configuration. For the MCM machine, for a certain PCB, one bitstring length was 140 bits. CHC passes a chromosome to the HLG evaluation part of the program which executes, generating a specific layout from the chromosome and a figure of merit, in this case, the placement or cycle time, for the chromosome. The figure of merit is then passed back to the CHC program, which uses this information to generate new chromosomes. If a layout is produced that is the best seen so far, it is output to a file. This process of CHC generating new chromosomes from the old ones and passing them to the HLG which generates a layout and returns a figure of merit to CHC is repeated until either a fixed number of chromosomes has been generated and evaluated or the population of chromosomes has converged and diverged a fixed number of times (where coverage means that the worst solution in the population is as good as the best solution).

Figure 4A:
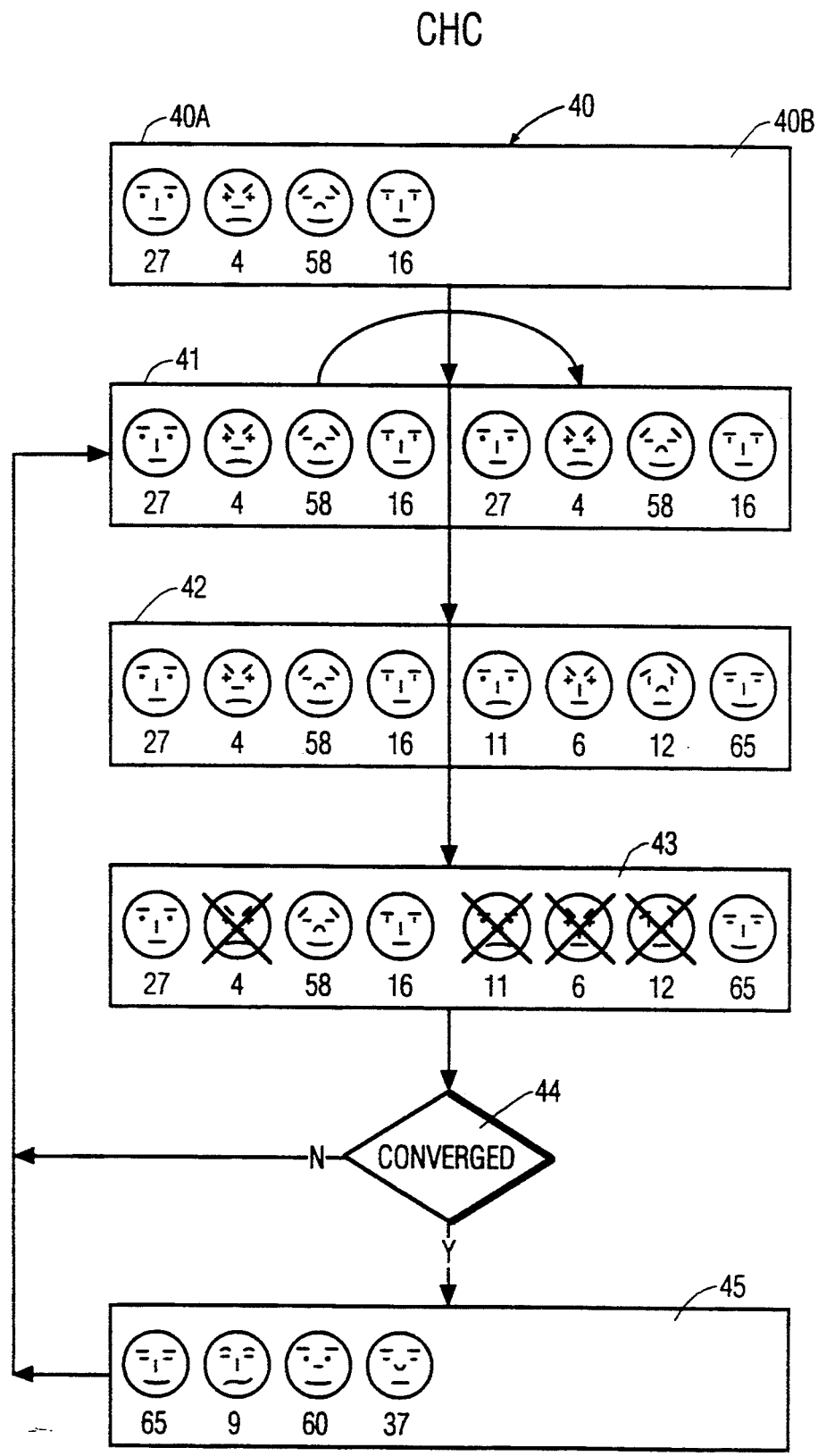
FIGS. 4A and 4B are simplified and more elaborate flow charts illustrating operation of the modified genetic algorithm, CHC, used in the invention.
Figure 4B:
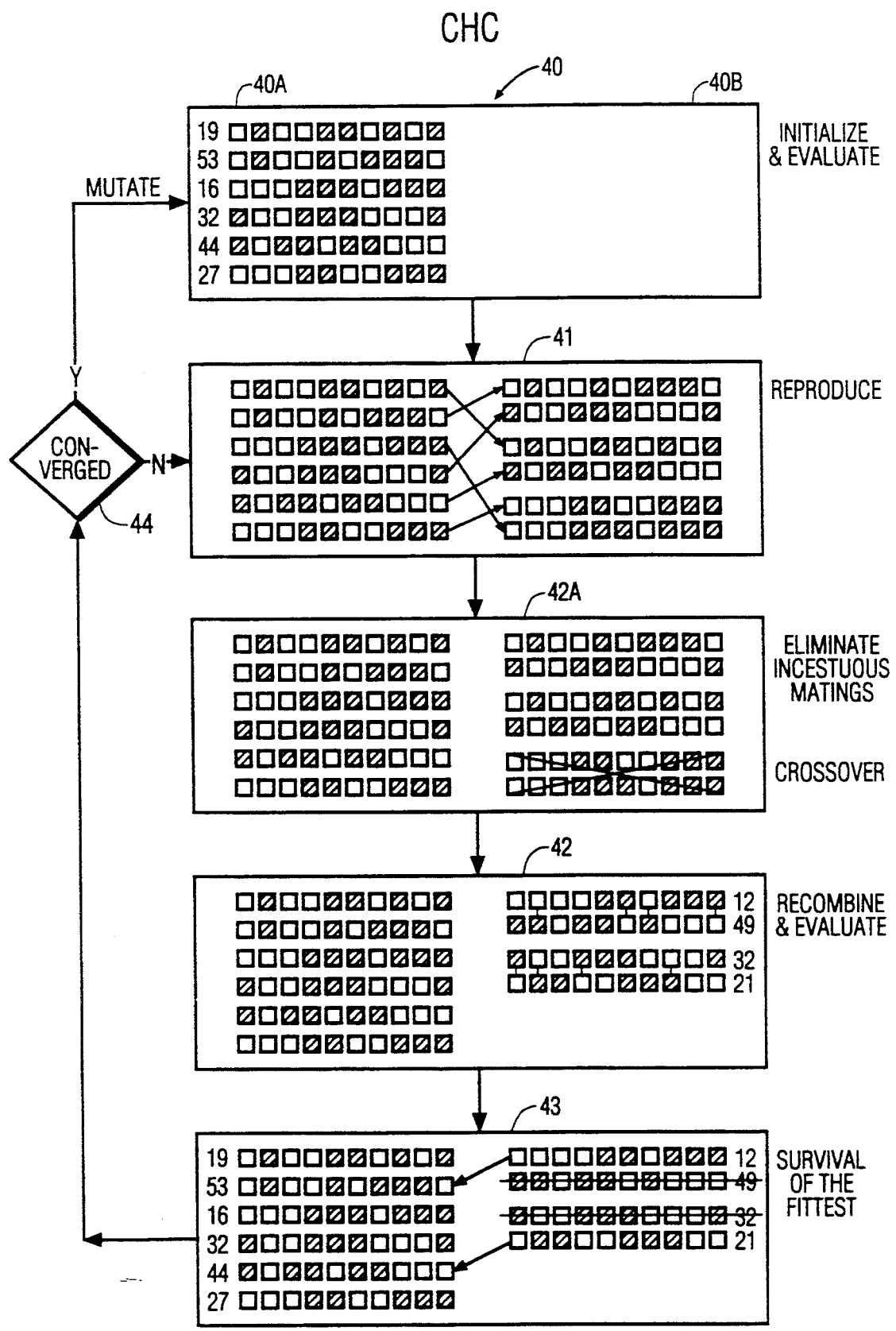

The genetic aspect of survival of the fittest can be illustrated in the flow chart shown in FIGS. 4A and 4B, of which FIG. 4A is a simplified view of FIG. 4B. The initial population of chromosomes is illustrated at 40 at the top with each of the four frowning/scowling faces representing a chromosome and the individual features corresponding to different bit values at different loci on the chromosome. In 4B each of the six rows of adjacent black and white squares represents a chromosome with the black squares representing ones and the white squares representing zeros. Although 4A illustrates a population size of four and 4B illustrates a population size of six, the typical population size is fifty.

The chromosome's score or figure of merit is shown under each face in FIG. 4A and at the end of each chromosome in FIG. 4B. In FIG. 4A, the highest score represents the best performance, so that the object of the algorithm is to maximize these scores. In FIG. 4B, the lowest score is optimal, so that the object is to minimize these scores.

In both FIG. 4A and 4B the left side represents the set of parents and the right side represents the children created from these parents. Each labeled box represents a succeeding time step. FIG. 40 represents the initial population of parent chromosomes. In the next step, 41, the parents on the left (faces in FIG. 4A and rows in FIG. 4B) are copied unchanged, but in random order, into the empty right section to form randomly paired mates. In the next step, 42A, shown in FIG. 4B but not FIG. 4A, pairs of individuals that are too similar are prevented from mating. As illustrated in 42A, the last mating pair is eliminated (incest prevention). In the next step, 42, features of the pairs of individuals are recombined (swapped via an operator called crossover) to form new children, and each new child chromosome is sent to the HLG and receives a figure of merit, shown under the smiley faces and to the right of the rows of boxes. In the next step, 43, the parent and child populations are merged and the worst individuals eliminated so that the number of remaining individuals is equal to the parent population size. FIG. 4A shows the best 4 out of the 8 faces being selected. FIG. 4B shows the best 6 out of the 8 rows being selected, i.e., two rows in the parent side are discarded, being replaced by the two best rows in the child side. A test at 44 determines whether convergence has occurred by comparing the scores of the worst and best members of the updated parent population.

If convergence has not occurred, the process goes through another iteration with the best selected population of 4 or 6 chromosomes serving as the new parents. If there is convergence, all but one of the chromosomes in the population is partially randomized (mutated), and the process continues. When either a fixed number of chromosomes has been created and evaluated, or a fixed number of converges has occurred, the process is halted.

Figure 5:
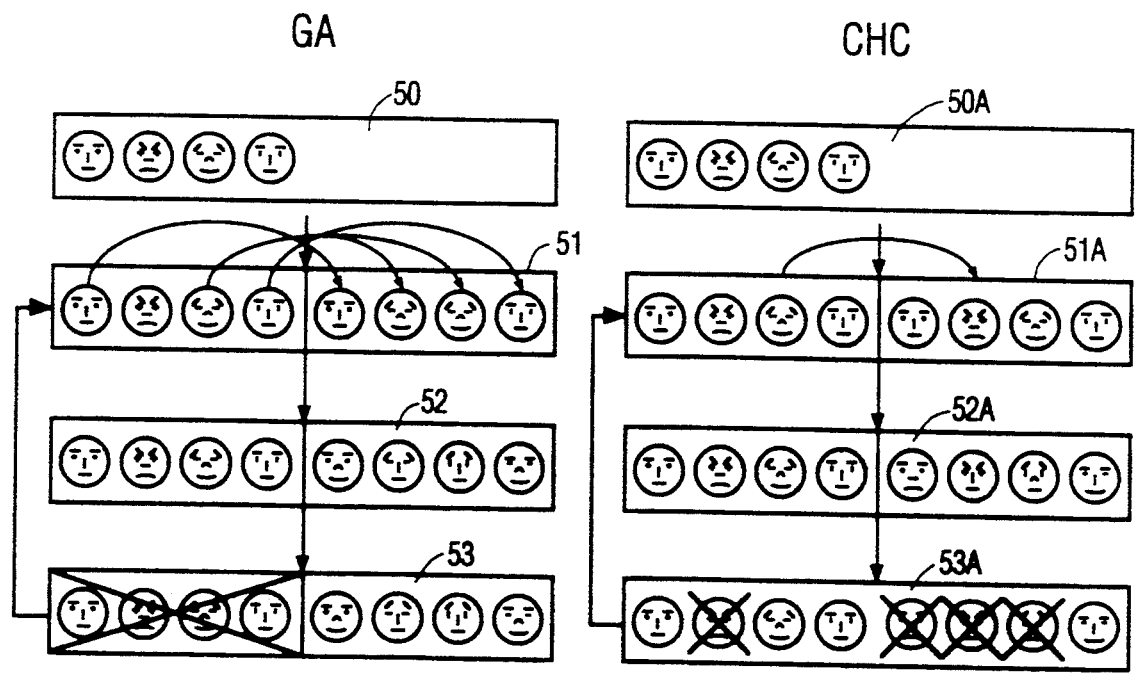
FIG. 5 are flow charts comparing the operation of a standard genetic algorithm with that of the modified algorithm used in the invention.

As mentioned earlier, the CHC algorithm differs in four significant respects from a conventional GA in that it uses a more disruptive form of crossover than a traditional GA, selection is based on survival-of-the-fittest rather than reproduction-with-emphasis, incestuous matings are prevented and the method of crossover is more vigorous, and mutation is applied to restart the process only when the population has converged. The first difference is illustrated in FIG. 5, which compares on the left a standard GA approach to that of CHC on the right.

At 50 and 50A, both algorithms start with the same population of initial parent chromosomes represented by the 4 faces on the left. In the traditional GA, in the next step, more copies are made of better parents and fewer copies of worse parents, as illustrated in 51 where two copies are made of the third, but no copies of the second, scowling face. In CHC, on the other hand, one copy is made of each parent as illustrated in 51A. In the GA, all the offspring on the right replace all the parents on the left as illustrated in 53, whereas in CHC the better offspring replace the worst parents as illustrated in 53A.

The parameters represented by bits or sets of bits of the chromosome string and which guide or control how a layout and a charge map are generated for controlling the machine operation and which generally is machine dependent, is an important aspect of the invention. For the MCM type of machine, the following rules were chosen to determine the parameters to be represented by the chromosome bits and their desirability for arriving at the optimal or near optimal machine layout. Those rules are as follows:

(ai) parameters for controlling the priority of assigning gripper types and the number of feeders ideally associated with each gripper type;

(aii) parameters for controlling the assignment of pipette positions to gripper types by assigning the priority to the following criteria: reachability limitations, tightness of fit, multiplace opportunities;

(aiii) parameters for controlling how feeders are allocated to grippers by specifying the initial number of feeders per pipette position assigned per gripper type and for controlling in what order feeders are assigned (ascending or descending order);

(aiv) parameters for controlling how parts are distributed over feeder positions by controlling how tightly parts are packed;

(av) parameters for controlling which parts are assigned to which feeders by controlling the order that part types are assigned (ascending or descending order).

The charge map generator, HLG, executes a program having an algorithm that uses the following steps and parameters to generate a charge map. Herein the terms "charge map generator" and "heuristic layout generator" are both used to refer to the algorithm HLG, because that algorithm generates both a layout and a charge map.

(bi) Until all feeder slots have been allocated:
　Choose a gripper type gt (based on ai)
　Choose a pipette position pp for gt (based on aii)
　If pipette position pp available:
　　Allocate feeders reachable by pp (based on aiii)
　Else
　　Allocate unused feeder for a pipette already assigned gt (bii) For each gripper type assigned:
　Determine how many feeders will be assigned to each part type (based on aiv)
　Assign parts to specific feeders (based on av)

The chromosomes generated by the CHC algorithm are tested or evaluated by applying them in turn to the HLG. New chromosome strings are generated and tested in a series of iterations until either a specified number of chromosomes have been generated and tested, which would be likely to result in a high-quality configuration—a typical number is in the range of about 10,000 to 100,000 chromosomes—, or the population has been brought to convergence a specified number of times, with an expected similar result—a typical number here is in the range of about 5 to 10.

The technique on which the invention is based—using a modified GA to solve the configuration problem for placement machines of the type described—is not limited to the MCM type of machine. When applied to other machines with similar problems, then some modifications in the algorithms are necessary, especially in the governing parameters which are machine dependent, but the principles remain the same. This will be evident from the detailed example that now follows with respect to the Model FCM Philips Component Placement machine.

Figure 6:
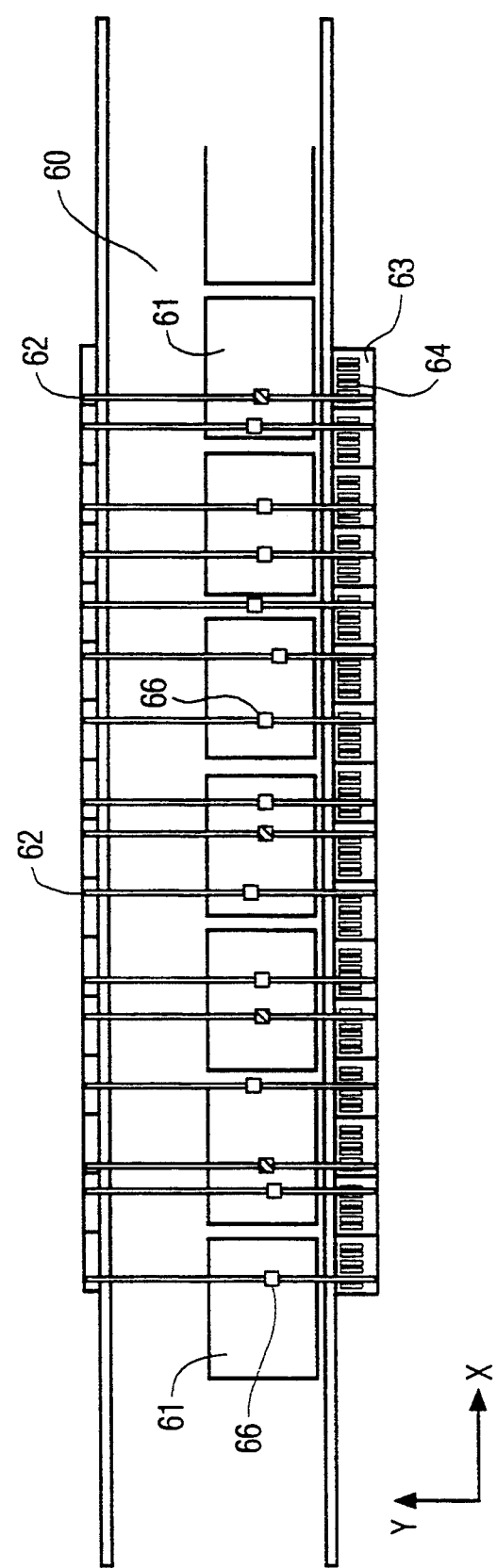
FIG. 6 is a schematic view from the top of a model FCM machine with sixteen pipette modules. The FCM parts placement machine is of the type for which the method of the invention is suitable.
Figure 7:
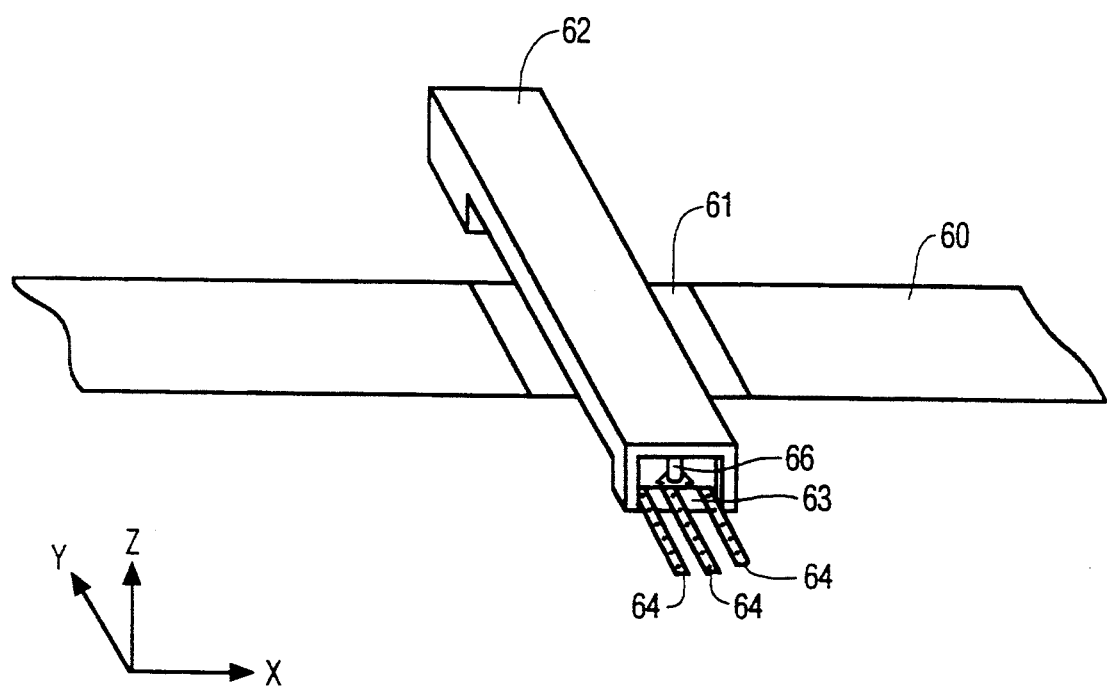
FIG. 7 is a perspective view of a one pipette module for a model FCM machine which can use the inventive method.

A top view of the FCM machine is schematically depicted in FIG. 6 and a perspective view in FIG. 7. It essentially consists of a transport system 60 that carries a train of printed circuit boards (PCBs) 61 under a series of (up to) 16 independent pick-and-place modules (PMs) 62. The transport system 60 advances in steps (index steps) between which the PCBs rest stationary for a moment while the Pms place some components. Each PM has a feeder bar 63 (in front of the machine as shown in FIG. 6) to which can be attached a variety of component feeder types 64 (tapes or sticks of varying widths, or bulk feeders). Each PM 62 is 120 mm wide with 80 mm of this being its reachable zone. There are physical barriers between PMs so that no interference between PMs is possible. Feeders must be placed within the reachable zone on the feeder bar 63 and for this purpose there are 6 holes drilled at 16 mm intervals to which feeders are attached. These hole positions are called feeder slots and are numbered 0 through 5 (left to right in FIG. 6). Left to right is the direction of travel for the transport system. New PCBs enter the FCM at the left end and completed PCBs exit from the right end. Each PM 62 has a single movable head 66 with independent servo control in the x (left to right), y (front to back), z (up/down), and phi (rotation about z) directions. These servos have different accelerations and maximum velocities, and so the travel time from a pick to a place position is the maximum of the x, y, and phi times. Movement in the z direction is accounted in a fixed delay for pick and for place. Each head may be fitted with a particular vacuum nozzle for picking up parts and a chuck for accurate mechanical alignment. A nozzle-chuck combination is sometimes called a gripper and each component to be placed (part) may have a particular gripper type designated.

The optimization task is: given a parts list, specifying the x,y,phi location of each part to be placed along with its gripper and feeder type, and given a specification of the line of FCM machines (how many machines, how many PMs on each), produce a layout and a charge map that will minimize the time required to populate the PCBs with all their parts (cycle time). It is further desired of the optimization that FCM users be able to constrain the solutions by prespecifying upper limits on the number of grippers of a particular type that are used, and/or the number of feeders feeding a particular part type. They should desirably also be free to prespecify that particular grippers be assigned to specific PMs and that particular slots must feed particular part types. Some PMs and some slots may also be prespecified to not be used. The optimization task just described is called the single-board problem. In addition, the optimization desirably should handle the family-of-boards problem. A family of PCBs comprises several closely related boards (the family members) with the same external dimensions and sharing most of their parts. Some parts will be unique to one or more of the family members. The optimization goal for a family-of-boards problem is to minimize the cycle time for a given mix of family members where the solutions for all family members share the same layout (i.e. the production line may switch from one family member to another without changing any of allocations of grippers to pipettes or parts to feeders).

The movement of the transport system between index steps is prespecified as shown in Table 1. It is required that the sum of the index step motions equal the pitch. The pitch of a PCB is the distance between successive PCB's on the conveyor, for convenience of the transport system, all boards are assigned a pitch from the alternative listed in Table 1. The transport system picks up a new PCB, advances the tabulated number of index steps, and then returns to the left end where it picks up another board. All boards in process are then picked up and advanced in unison in cycles of index steps until they exit the FCM at the right end. For example, all 80 pitch boards advance 120 mm each step, the distance between PMs. Since small boards fit completely within the reachable zone of a single PM, a new board is picked up each 1-step cycle. At the other extreme, 480 pitch boards take six index steps to pass each PCB under a PM.

TABLE 1

| pitch (mm) | number of steps | The Index Steps steps | | | | | |
|---|---|---|---|---|---|---|---|
| | | 1 | 2 | 3 | 4 | 5 | 6 |
| 80 | 1 | 120 EF | | | | | |
| 120 | 2 | 80 F | 40 E | | | | |
| 160 | 2 | 80 EF | 80 | | | | |
| 200 | 3 | 80 | 80 F | 40 E | | | |
| 240 | 3 | 80 F | 80 E | 80 | | | |
| 280 | 4 | 40 | 80 E | 80 | 80 F | | |
| 320 | 4 | 80 E | 80 | 80 F | 80 | | |
| 360 | 5 | 40 E | 80 | 80 F | 80 | 80 | |
| 400 | 5 | 80 | 80 F | 80 | 80 | 80 E | |
| 440 | 6 | 40 E | 80 | 80 F | 80 | 80 | 80 |
| 480 | 6 | 80 | 80 F | 80 | 80 | 80 | 80 E |

E means that a visual inspection operation (EVA) happens at that step
F means that the first parts are placed at that step The feeder types known at this time are listed in Table 2. For each feeder type (T=tape, S=stick, B=bulk) the table lists the dimension (left and right of the center line which aligns with the feeder bar hole), the number of positions where a unique part type may be picked up, and the x and y coordinates of the pick positions (relative to the feeder bar hole it is placed in). Dimensions are in micrometers.

TABLE 2

| feeder type | left dimension | right dimension | number of picks | x-y coordinates of picks |
|---|---|---|---|---|
| S15 | 7500 | 7500 | 1 | +2000,0 |
| B32 | 7500 | 23800 | 4 | −4000,0 +2000,0+12000,0+18000,0 |
| T8 | 8000 | 7800 | 1 | +2000,0 |
| T12a | 10000 | 9800 | 1 | +2000,0 |
| S20 | 9500 | 10500 | 1 | +2000,0 |
| S25 | 12000 | 13000 | 1 | +2000,0 |
| T12b | 11200 | 14500 | 1 | +2000,0 |
| T16 | 13200 | 16500 | 1 | +2000,0 |
| S30 | 14500 | 15500 | 1 | +2000,0 |
| S40 | 15500 | 20500 | 1 | +2000,0 |
| T24 | 17200 | 20500 | 1 | +2000,0 |
| T32a | 21900 | 25000 | 1 | +2000,0 |
| T32b | 22500 | 24700 | 1 | +2000,0 |
| T44 | 28500 | 30700 | 1 | +2000,0 |

Summarizing, in the general approach we use to solve the problem, using the interacting GA and HLG, the HLG has many embedded parameters that can alter its behavior. The HLG might be considered a family of algorithms rather than a single one. The genetic algorithm (GA) has the task of locating a good set of these tuning parameters using its evolutionary approach. Each chromosome specifies a complete set of the HLG parameters. Each call to the HLG attempts to solve the given FCM optimization task. The cycle time resulting from this attempt is treated as the "fitness" of the chromosome. Beginning with a random population of chromosomes, the GA cycles through generations of new chromosomes, each produced from the previous generation by preferentially allowing survival of the fittest members and producing offspring (new chromosomes to be tested) from them by a process of crossing over their genes (the HLG parameters) to yield new combinations of genes.

For more details on the workings of GAs in general, see Goldberg "Genetic Algorithms in Search, Optimization, and Machine Learning", Addison Wesley, Reading, Mass., 1989, and the referenced Eshelman paper on the CHC, the modified GA.

The task of the HLG is to produce a complete feasible solution to an FCM layout problem if it can. If it succeeds, it returns to the GA the cycle time for the solution it found. If it fails, it returns a numeric value, heuristically determined that should reflect how close it came to finding a feasible solution. This heuristic value is chosen so that all feasible solutions should score lower (better) than all infeasible ones, and that among infeasible solutions, those closer to feasibility score better.

Figure 8:
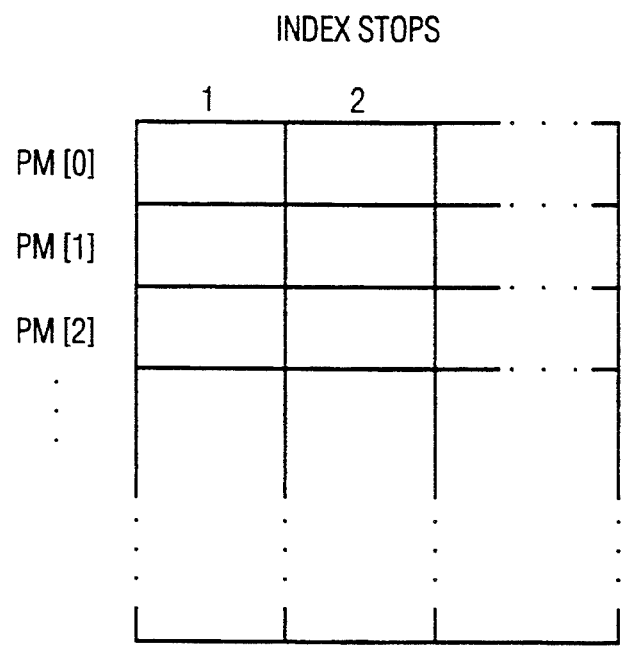
FIGS. 8–10 illustrate some concepts used in the FCM machine algorithms.

A useful concept used by HLG is that of a bucket. There is a bucket defined for each PM at each index step. They serve as the receptacles used by the balancing algorithm into which parts are placed and over which balance is to be maintained. FIG. 8 illustrates the idea. All buckets in the same index step (column in FIG. 8) share the same heartbeat time: the execution time of the slowest PM. The cycle time of the whole machine/line is approximated by the sum of the heartbeats for all index steps. The true cycle time must account for the movement of the transport system and the movement of the heads between pick positions, but can deduct the head movement times that occur simultaneously with transport movement. HLG consists of five steps:

Step 1. assign grippers to PMs
Step 2. assign feeder types to PM feeder slots
Step 3. assign parts to buckets
Step 4. permute part types among feeders on each PM
Step 5. sequence the parts placed in each bucket.

Each step makes irrevocable decisions, possibly guided by parameters in the chromosome (steps 1-3), employing heuristics and using proxy performance measures. Steps 1 and 2 use a heuristic measure of the "desirability" of each alternative placement and greedily selects the best in each cycle. Step 3 uses the pick-and-place time (pp_time) for each part as it assigns them to buckets, trying to maintain good time balance. Since the pick positions of the parts and their pick sequence are not determined until subsequent steps, pp_time must be estimated. HLG maintains two estimates for each part: pp_time_lower and pp_time_actual. Pp_time_lower is the round trip time from the feeder bar (y=0) to the place position (y=part_y) and back, including a pick and a place delay. This value is the maximum of the time taken by either the y or the phi servos. The travel of the x-servo cannot be determined until the pick position is selected. Once the pick positions are determined (Step 4), then pp_time_actual is the maximum of the round trip time for the x-servo and pp_time_lower.

The cycle time returned by HLG to the GA as the fitness of each chromosome, is a true cycle time calculation including the movement times for the transport system, the sequential pickups in their final order, and the parallelism that the FCM can achieve with PMs moving while the boards are moving.

The following sections briefly describe the operation of each step.

Step 1. Assign grippers to PMs
Pseudo code for this step is shown below (H1 and H2 refer to heuristics explained below):
assign_pipettes()
if(number of grippers=1)
 assign this gripper to all PMs
compute the number of PMs without grippers preassigned while (there are PMs left to assign)
 Compute the desirability of each gripper (H1).
 For the most desirable gripper, compute the desirability of each PM not yet assigned (H2).
 Assign the most desirable gripper to the most desirable PM.

Heuristic H1 employs two parameters from the chromosome for each gripper type (a weight and a gripper preference bit) and two precomputed constants that depend on the problem being solved and the line specified (the maximum and minimum number of PMs). The minimum_PMs is estimated by considering the number of feeder slots covered by each feeder type needed for the parts using each gripper. This calculation is somewhat conservative and so the true minimum required may be higher (i.e. there is no guarantee that if minimum_PMs is assigned, that a feasible solution will result). A target_PMs is computed by estimating the fraction of the total pp_time needed by each gripper type. The maximum_PM is either a limit set by the user, or the total number of PMs available minus the minimums required by all other grippers. Using these constants, and the variable PMs_assigned, each gripper's desirability (H1) is calculated as follows:

$$\text{diff}(g) = \text{target\_PMs}(g) - \text{PMs\_assigned}(g)$$

$$\text{desirability}(x) = \begin{cases} \text{wt}(g)\left[1 + \dfrac{\text{diff}(g)}{\text{target\_pms}(g)}\right] & \text{if diff} > 0 \text{ and PMs\_assigned}(g) < \text{maximum\_PMs}(g) \\ 0.1\,\text{wt}(g)\left[1 + \dfrac{\text{diff}(g)}{\text{target\_pms}(g)}\right] & \text{if diff} \leq 0 \text{ and PMs\_assigned}(g) < \text{maximum\_PMs}(g) \\ \text{a\_large\_negative\_value} & \text{if pMs\_assigned}(g) \geq \text{maximum\_pMs}(g) \end{cases} \quad (2)$$

By manipulating the weights and the gripper preference bits (used to break ties in desirability) in the chromosome, the CHC is able to produce a wide variety of assignments of grippers to PMs.

Heuristic H2 involves a precomputed desirability for each gripper on each PM and a preference_bit in the chromosome for each gripper. The desirabilities are computed once as soon as the parts are known and the FCM line is defined, including any preassignments. The gripper-PM desirability represents the opportunities a gripper has to place its parts on that PM. It is a count that is incremented for each part that may potentially be placed in each slot in each index step. To be potentially placeable, a proper feeder type must have been preassigned or a slot must be free. In addition, the part's X position must be accessible in the index strip. This desirability reflects the differences that sometimes arise between PMs as to which x-positions are exposed in two successive index steps when a 40 mm board movement occurs.

The preference_bit resolves ties in favor of the first or last PM in the line with the same desirability. Thus, the chromosome can dictate that a particular gripper will tend to be placed from the beginning or end of the line.

Step 2. Assign feeder types to PM feeder slots

Pseudo code for this step is shown below. Since the grippers have been placed on PMs at this point in the algorithm, each gripper specifies an independent set of PMs with independent feeder assignment choices.

```
assign_feeder_types ()
    for(each gripper)
        while (some feeder type has positive desirability
               and some slots are still available)
            compute the desirability of each feeder type
                (H3)
            for the most desirable feeder type, compute
                the desirability of each available slot (H4)
            place most desirable feeder type in most desir-
                able slot
        compute the shortfall=sum of pick positions
            required that could not be achieved
        return (shortfall)
```

Heuristic H3 employs a parameter from the chromosome for each feeder type required for each gripper type (a weight, wt(g,f)). The desirability calculation is in terms of pick positions. Most feeder types have a single pick position per feeder, the exception being bulk feeders which have four. Two constants are computed for each feeder type (f) required for each gripper type (g): min_picks(g,f)=number of part types (g,f) max_picks(g,f)=number of parts (g,f) A separate feeder is required for each part type in order for a feasible solution to be possible and there is no reason to assign more feeders than there are parts of each type. Using these constants, and the variable picks_assigned(g,f), each feeder type's desirability is calculated as follows:

Step 3. Assign parts to buckets

Figure 9:
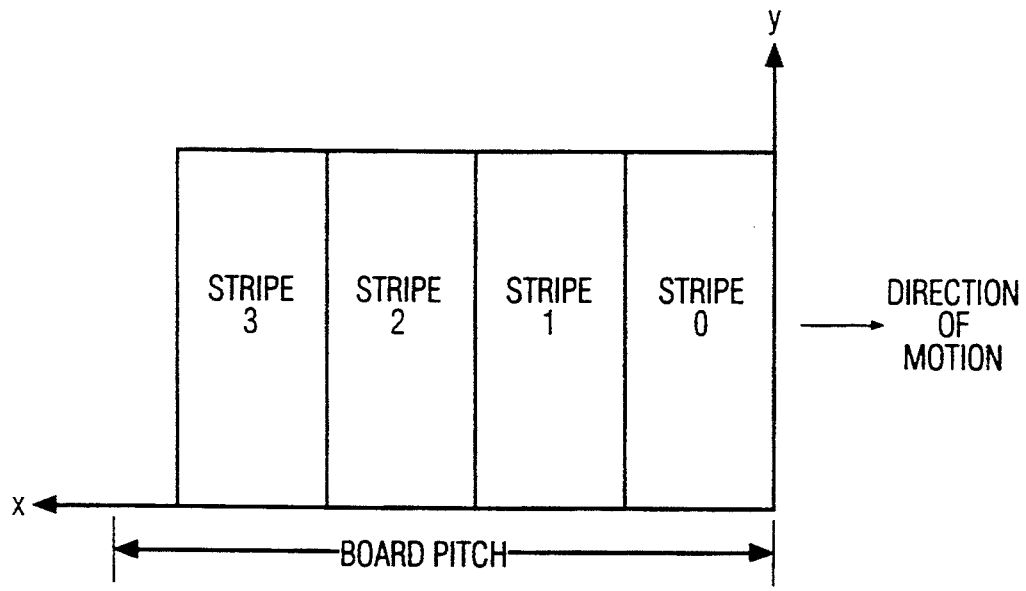

This algorithm may be considered the heart of the HLG. Its job is to distribute the pick-and-place workload among the buckets so as to minimize the idle time of all PMs during all index steps. It works within the framework of the assignments made in the two previous steps and works with a sorted list of the parts (or part groups). The software offers the option of placing parts in groups or individually. A group consists of all parts of the same type whose board positions are all within the same stripe. A stripe is a 40 mm vertical slice of the circuit board as illustrated in FIG. 9. The algorithm always works on part groups. When the user selects the option to place parts individually, it simply builds 1-part groups. The sorting of the parts (groups) for bucket assignment is controlled by 8 bits in the chromosome. The first 4 bits are interpreted as an index into a table of sort orders illustrated in Table 3. The remaining 4 bits flag the sort order as either ascending (1) or descending (0) for each sort field in the order:ppt, st, pt, gt.

TABLE 3

The Part Sort Control

| bits | integer | sort order |
|------|---------|------------|
| 0000 | 0 | ppt × st × pt |
| 0001 | 1 | ppt × st × gt × pt |
| 0011 | 2 | ppt × pt × st |
| 0010 | 3 | ppt × gt × st × pt |
| 0110 | 4 | ppt × gt × pt × st |
| 0111 | 5 | st × ppt × pt |
| 0101 | 6 | st × ppt × gt × pt |
| 0100 | 7 | st × pt × ppt |
| 1100 | 8 | st × gt × ppt × pt |
| 1101 | 9 | pt × ppt × st |
| 1111 | 10 | pt × st × ppt |
| 1110 | 11 | gt × ppt × st × pt |
| 1010 | 12 | gt × ppt × pt × st |
| 1011 | 13 | gt × st × ppt × pt |
| 1001 | 14 | gt × st × pt × ppt |
| 1000 | 15 | gt × pt × ppt × st | ppt = pp_time
st = stripe
pt = part type
gt = gripper type $$\text{desirability}(g,f) = \begin{cases} wt(g,f)\left[1 + \frac{\min\_picks(g,f) - picks\_assigned(g,f)}{\min\_picks(g,f)}\right] & \text{if assigned} < \min \\ wt(g,f)\left[\frac{\max\_picks(g,f) - picks\_assigned}{\max\_picks(g,f) - \min\_picks(g,f)}\right] & \text{if max} > \text{assigned} > \min \\ 0 & \text{if assigned} \geq \max \end{cases} \quad (3)$$

By manipulating the weights in the chromosome, CHC in conjunction with HLG is able to produce a wide variety of assignments of feeder types to slots.

Heuristic H4 computes a tightness-of-fit measure for each feeder type with the other feeder types already placed and the physical boundaries of each PM. The space_left(f,p,s) is the free space between the left edge of feeder type f and the right edge of its nearest neighbor (either the left wall or the nearest feeder to its left) if it were to be placed in slot s on PM p. The space_right(f,p,s) is defined analogously. The each desirability is calculated as:

$$\text{desirability}(f,p,s) = \max\{\text{space\_Left}(f,p,s), \text{space\_right}(f,p,s)\} \quad (4)$$

This heuristic has the effect of packing feeders tightly together within a PM while simultaneously tending to spread them out among PMs thus maximizing the opportunities for later balancing the pick_and_place effort across PMs. Note that there is no guarantee that all assigned feeders will actually be used when Step 3 assigns the actual parts.

Pseudo code for this step is shown below:

```
level()
    while (there is another part group to place from the
           sorted list)
        find all possible buckets (C1)
        if no eligible buckets exist
            return(part groups remaining to place)
        select a bucket (H5)
        place the part group in the chosen bucket
    return (zero)
```

The conditions (C1) for a bucket to be "possible" are:
  assigned gripper type must match
  one of the two stripes under the PM must match
  an appropriate feeder type must be available (either free or already assigned to the right part type)

The selection of the best bucket is done by a simple greedy algorithm with a bit of control in the chromosome. The usual greedy heuristic is choose the bucket with the most slack time, where slack time is the pp__time difference between the current heartbeat time (i.e., the total pp__time for the slowest PM) for the bucket's index step and the total pp__time for all parts already in that bucket. Pp__time__lower, is used here since the decision on the pick position to be used is made in a subsequent step of the algorithm. The bucket__choice__ bit from the chromosome (one for each part group) allows the usual criterion to be overridden in favor of choosing a bucket with a feeder already allocated to the appropriate feeder type. This allows the greedy leveler to behave as a complex mixture of best-fit and fit-to-conserve-feeders strategies for each of the 208 possible sort orders. Note that for some problems some of the sort orders may be redundant (e.g. if there's only one gripper type).

Step 4. Permute part types among picks

This algorithm is fixed in that there is no control in the chromosome to alter its behavior. It simply visits each PM in turn and tries to permute the part types among compatible feeders. The goal of this permutation is to try to minimize any compromise in the assumed pp__time__lower that results if a part's pp__time becomes x-servo limited because of its pick location. The x-servo penalties (the amount by which pp__time__lower would be increased) are computed for each part in the "danger zone" (see below) if it were placed in each of the compatible pick locations available. The x-servo penalties are summed for all index steps and the sum is reduced by any slack time that may be available. If the resulting penalty is zero, then no permuting is done. Otherwise, permutations are tried systematically until either a zero cost permutation is found or a preset limit on the number of permutations is reached. Currently this limit is set to 720 (6!=720). This value allows us to guarantee that an optimal permutation will be found for all feeder types except bulk feeders which can present 11 pick positions on a single PM (11!=39916800). Experience to date suggests that this algorithm usually reports a zero cost solution while trying only a small fraction of the allowed 720 permutations.

Figure 10:
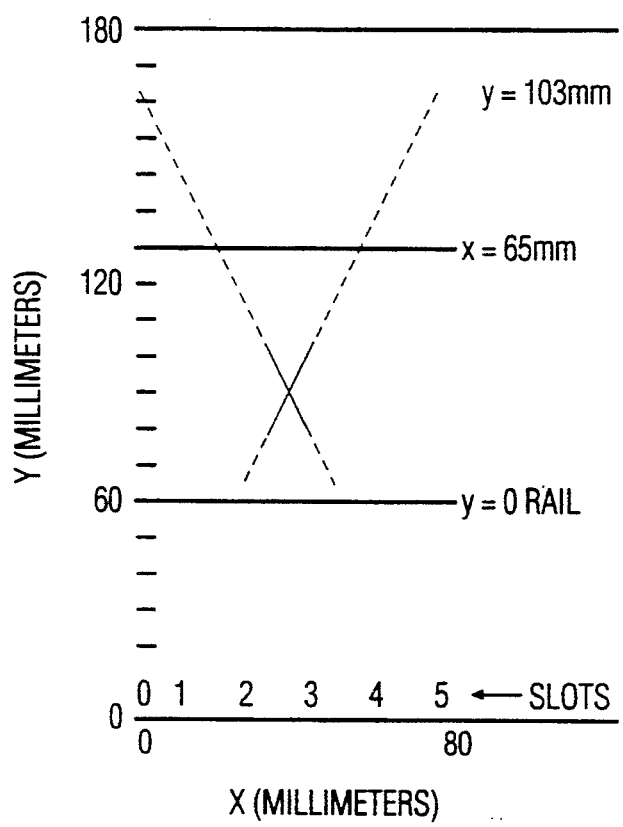

The danger zone is that region of the circuit board, close to the feeder bar, where it becomes possible that the travel time of the x-servo may be greater than that of the y-servo or phi-servo. This region is depicted in FIG. 10. The horizontal line at y=65 mm represents the limit above which the x-servo worst case (traveling 80 mm) will not be worse than the worst case for the phi-servo. The two slanting lines represent the locus of points for which the y-servo travel equals the worst case x-servo travel (from pick positions 0 and 5 respectively). Parts whose position on the circuit board lies above these regions will not become x-servo bound regardless of which pick position they are picked from. Only parts within this region need to be of concern to the permutation algorithm.

Step 5. Sequence the parts placed in each bucket

This algorithm also is fixed in that there is no control in the chromosome to alter its behavior. It visits each bucket in turn and sorts the parts to be placed in order of their pick position: left-to-right for odd numbered index steps and right-to-left for even numbered steps. Thus a PM that places parts in every step will alternately sweep across the feeder bar, first to the left and then to the right.

Figure 11:
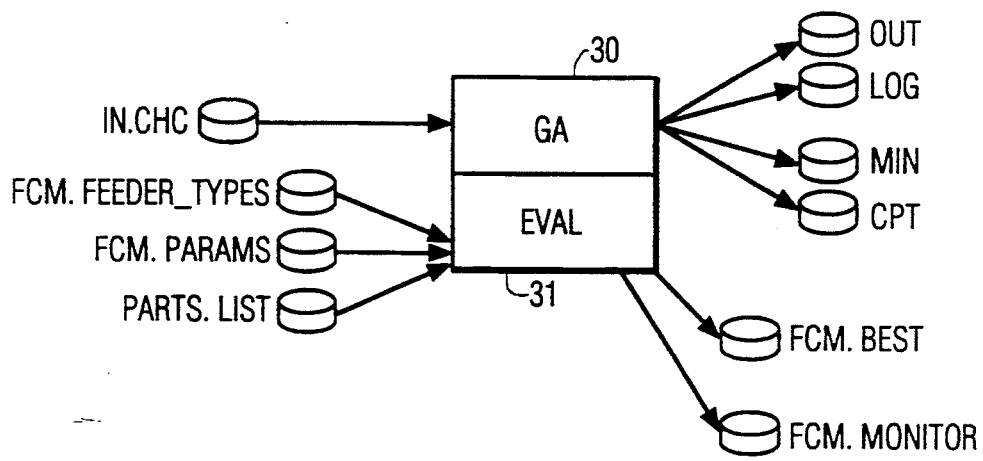
FIG. 11 is a block diagram of the input/output files used in the FCM program.

FIG. 11 is similar to FIG. 2 except that the internal communication between the GA and the HLG are not shown and the external files are shown. Once the input files are available, the program (chc.fcm) is executed.

Output Files

The fcm.best file is overwritten during a search whenever a new solution is found that is better than the previous best. It consists of a series of "paragraphs" each describing a different aspect of the solution. The first paragraph summarizes the PCB information provided in the parts.list file. An example is given below:

TITLE:PCB-3
pitch=360000
n__parts=910
n__part__types=45
n__gripper__types=4
gripper type 1 has 26 part types requiring 3 pipette modules (minimum)
gripper type 2 has 7 part types requiring 2 pipette modules (minimum)
gripper type 3 has 7 part types requiring 1 pipette modules (minimum)
gripper type 4 has 5 part types requiring 1 pipette modules (minimum)
feeder type B32 has 33 part types
feeder type T8 has 12 part types The second paragraph, given below, echoes the information in the fcm.params file as illustrated below.

LINE:
FCM machines in line
16 total pipette modules in line
16 pipette modules used
MACHINE: FCM[0] with 16 pipette modules
    PM[0] gripper FREE has 6 slots
    PM[1] gripper FREE has 6 slots
    PM[2] gripper FREE has 6 slots
    PM[3] gripper FREE has 6 slots
    PM[4] gripper FREE has 6 slots
    PM[5] gripper FREE has 6 slots
    PM[6] gripper FREE has 6 slots
    PM[7] gripper FREE has 6 slots
    PM[8] gripper FREE has 6 slots
    PM[9] gripper FREE has 6 slots
    PM[10] gripper FREE has 6 slots
    PM[11] gripper FREE has 6 slots
    PM[12] gripper FREE has 6 slots
    PM[13] gripper FREE has 6 slots
    PM[14] gripper FREE has 6 slots
    PM[15] gripper FREE has 6 slots
    strategy: place parts individually The FEEDER SUMMARY paragraph describes the assignments of grippers to PMs, feeder types to slots, and part types to pick positions. Part of such a paragraph is shown below. Note that a feeder type may have been assigned and then not actually used (see PM[0] slot[5]). It should also be mentioned that a slot is "blocked" only if a feeder in a neighboring slot actually extends over the slot location. A slot might be labeled FREE, but be "effectively blocked" if a neighboring feeder comes so close that no feeder could be placed without interfering.

| FEEDER SUMMARY | |
|---|---|
| FCM[0] PM[0] gripper:4 | |
| slot[0] feeder type:T8 | part__type 12 |
| slot[1] feeder type:T8 | part__type 22 |

-continued

| FEEDER SUMMARY | |
|---|---|
| slot[2] feeder type:T8 | part_type 20 |
| slot[3] feeder type:T8 | part_type 13 |
| slot[4] feeder type:T8 | part_type 21 |
| slot[5] feeder type:T8 | part_type FREE |
| FCM[0] PM[1] gripper:1 | |
| slot[0] feeder type:B32 | |
| | pick [0] part_type FREE |
| | pick [1] part_type 6 |
| | pick [2] part_type 5 |
| | pick [3] part_type 39 |
| slot[1] blocked | |
| slot[2] feeder type:B32 | |
| | pick [0] part_type 44 |
| | pick [1] part_type 1 |
| | pick [2] part_type 4 |
| | pick [3] part_type 31 |
| slot[3] blocked | |
| slot[4] feeder type:B32 | |
| | pick [0] part_type 38 |
| | pick [1] part_type 43 |
| | pick [2] part_type 32 |
| | pick [3] part_type 7 |
| slot[5] blocked | |

The next paragraph depicts the parts actually placed during each index step of the solution. Below shows the beginning of such a paragraph. First the index stepping is described with an "E" marking the step where EVA occurs (a visual inspection), and "F" marking the step in which parts are first placed on a new board by PM[0]. Below this, each bucket is listed showing the board stripes it sees,"the heartbeat time (pp_time estimates ignoring the movement of the transport system), the sum of the estimated pp_times for all parts placed in the bucket, and the slack_time (heartbeat—pp_time). All times are in milliseconds. Then the part numbers of the parts placed are listed in the order they are placed. After each part number, three characters appear in brackets [abc] where a is the slot and b is the pick position from which it is taken, and c is "x", "y" or "p" depending on whether the pp_time is bound by the x-, Y-, or phi- servo- Note that the slots in alternating index steps are arranged alternatively left-to-right and right-to-left reflecting the simple heuristic for step 5 of the HLG (see §4).

| SOLUTION | | | | | |
|---|---|---|---|---|---|
| index steps: | 0 | 1 | 2 | 3 | 4 |
| size (mm): | 40 | 80 | 80 | 80 | 80 |
| | | E | F | | |
| FCM[0] PM[0] | | | | | |
| stripes: | 5,6 | 7,8 | 0,1 | 2,3 | 4,5 |
| heartbeat: | 9561 | 8471 | 12582 | 14127 | 12177 |
| pp_time: | 7783 | 3494 | 8205 | 13267 | 8952 |
| slack_time: | 1778 | 4977 | 4377 | 860 | 3225 |
| part: | 868[00y] | 910[10y] | 862[00y] | 894[40y] | 866[00y] |
| part: | 908[10y] | 909[10x] | 861[00y] | 896[40y] | 865[00x] |
| part: | 888[20y] | 869[00x] | 901[10y] | 893[40p] | 867[00y] |
| part: | 890[20y] | 870[00y] | 902[10p] | 895[40x] | 906[10y] |
| part: | 889[20p] | | 882[20y] | 873[30p] | 905[10x] |
| part: | 880[30p] | | 881[20p] | 876[30p] | 907[10p] |
| part: | 879[30x] | | 872[30y] | 874[30y] | 887[20p] |
| part: | 900[40y] | | 871[30p] | 875[30y] | 878[30y] |
| part: | 899[40x] | | 892[40y] | 884[20y] | 877[30p] |
| part: | | | 891[40p] | 886[20y] | 898[40y] |
| part: | | | | 883[20x] | 897[40p] |
| part: | | | | 885[20p] | |
| part: | | | | 904[10y] | |
| part: | | | | 903[10x] | |
| part: | | | | 863[00x] | |
| part: | | | | 864[00y] | |

The final paragraph, given below, gives two lower bound estimates for the problem, and the true cycle time (including the movement of the transport system). The first (unconstrained) lower bound (ULB) is simply the sum of the pp_time_lower for every part divided by the number of PMs used. It is a true lower bound that would result (ignoring transport movement) if all parts were y- or phi-servo bound, and no PMs had any slack_time. The second (constrained) lower bound (CLB) may not be a true lower bound because it depends on the assignment of grippers to PMs in the proposed solution. It is the maximum (among gripper types) of the sum of the pp_time_lower for all parts for each gripper type divided by the number of PMs assigned. In order to assess the quality of this lower bound, some summary statistics are given for each gripper type: the min_PMs needed (an estimate), the number of PMs actually assigned, and the optimum number of PMs. This latter figure is an unrealistic ideal and is usually not even an integer. It is the number of PMs that would result in an equal average workload (pp_time sums) for each gripper type. If the assigned_PMs are close to these numbers, then the CLB is probably a good one. The true cycle time is noted with the amount (percent) by which it exceeds the CLB. This figure is sometimes called the optimality gap. Finally, the GA records the experiment and trial at which this solution was found.

LOWER BOUND PICK & PLACE TIME (ignoring gripper-type allocations & transport): 51200 milliseconds
LOWER BOUND PICK & PLACE TIME (considering gripper-type
   allocations, but ignoring transport):    55745 milliseconds
GT: 1 min_PMs 3 assigned_PMs 10 opt_PMs 10.5
GT: 2 min_PMs 2 assigned_PMs 2 opt_PMs 2.2
GT: 3 min_PMs 1 assigned_PMs 3 opt_PMs 2.5
GT: 4 min_PMs 1 assigned_PMs 1 opt_PMs 0.8
TOTAL PICK & PLACE TIME (including transport): 57607 milliseconds
percent above lower bound = 3.340210
kost= 57607 found at experiment 0 trial 46128

Summarizing, for the FCM machine, the plurality of parameters represented in the chromosome string for controlling the HLG include the following:

a weight for each gripper type, which influences the order in which gripper-to-pipette decisions are made; a pipette preference bit for each gripper type (which breaks ties among equally desirable gripper-to-pipette decisions); a weight for each feeder type for each gripper type, which influences the order of decisions on feeder types to feeder slots; sort parameters, which influence the order in which PCB components are considered when assigning them to buckets; and a preference bit for each part, which influences the choice of bucket.

The basic similarities to the parameters of the MCM machine will be evident and may be summarized for both machines as follows:

1. assigning a weight for each gripper type,
2. assigning priorities to allocating the number of pipettes to be assigned to each gripper type,
3. assigning priorities for each feeder type for each gripper type,
4. determining an order for controlling how parts types are assigned to each feeder type.

These same kinds of parameters will generally have to be incorporated when constructing suitable chromosomes to represent the configuration of placement machines of these general types with multiple heads, multiple pipettes, multiple gripper types, and multiple feeders.

To complete the disclosure, some further examples of pseudocode code for the programs of the invention now follow.

```
Pseudocode for CHC
    procedure CHC
    begin
    t = 0;
    d = L/4;
    initialize P(t);
    evaluate structures in P(t);
    while termination condition not satisfied do
    begin
    t = t + 1;
    select C(t) from P(t-1);
    recombine structures in C(t) forming
        C'(t)
    evaluate structures in C'(t);
    select P(t) from C'(t) and P(t-1);
    if P(t) equals P(t-1)
        d—;
    if d < 0
    begin
        diverge P(t);
        d = r × (1.0 - r) × L;
    end
    end
    end.
    procedure select
    begin
            copy all members of P(t-1) to C(t) in random order;
    end.
    procedure select
    begin
      form P(t) from P(t-1)
        by replacing the worst members of P(t-1)
        with the best members of C'(t)
      until no remaining member of C'(t)
        is any better than any remaining member of P(t-1);
    end.
    procedure recombine
    begin
      for each of the M/2 pairs of structures in C(t)
      begin
        determine the Hamming distance
        if (Hamming distance/2) > d
            swap half the differing bits at random;
        else
        delete the pair of structures from C(t);
        end
      end.
    procedure diverge
    begin
      replace P(t) with M copies of the best member of
        P(t-1);
      for all but one member of P(t)
      begin
        flip r × L bits at random;
        evaluate structure;
      end
    end.
    variables
            M population size
            L string length
            t generation
            d difference threshold
            r divergence rate For the MCM:
HLG control parameters for MCM machines targeted number of pipettes and feeders per gripper type:
P_num_pipettes_targeted[gt]    number of pipettes per gripper type
P_num_feeders_targeted[gt]     number of feeders per gripper type
P_num feeders_per_pipette[gt]  number of feeders per pipette for
                                gripper type
flags for each gripper type controlling how parts are assigned
P_use_all_feeders[gt]          whether all available feeders are
                                to be used
P_packing_criterion[gt]        whether reachability or number is
                                major criterion for packing parts
weights for selecting gripper type
P_gripper_type_wt[gt]          priority of each gripper type
P_gripper_type_feeder_wt       importance of availability of
                                feeders
```

-continued

| | |
|---|---|
| weights for selecting pipettes | |
| P_reachability_wt | importance of reachability |
| P_fit_wt | importance of tightness of fit |
| P_multi_wt | importance of multiplace (in general) |
| P_multi_wt1 | importance of potential multiplace |
| P_multi_wt2 | importance of not blocking multiplace for rival gripper types |
| miscellaneous parameters | |
| P_first_pip | first pipette to be assigned gripper |
| P_low_1fu | whether to assign feeders to large parts beginning with low (1st) or high (4th) logical feed unit |
| P_single_align | whether to try to make sure that at most one alignment for a charge |

HLG algorithm for MCM machines

```
main
    assign_grippers to pipettes and allocate feeders
    assign_components to feeders and group components into
    charges
assign_grippers
    do until break
        for each gripper type (gt)
            determine desirability_of_gripper_type(gt)
        if no gripper type with positive desirability
            break
        else
            choose gripper type with highest desirability
        if chosen gripper type (gt) is the first gripper type
          chosen choose pipette indicated by parameter
          P_first_pip
        else
            for each pipette (pip) determine
                desirability_of_pipette(gt,pip)
              if some pipette with positive desirability
                choose pipette with highest desirability
                assign chosen gripper type to chosen pipette
                allocate feeders as indicated by
                P_num_feeders_per_pipette[gt] and P_low_1fu
            else
                for each pipette with same gripper type and
                available feeders determine
                    desirability_of_next_available_feeder(gt,pip)
                if no feeder with positive desirability
                    break
                else
                    choose feeder with highest desirability and
                    allocate feeder
desirability_of_gripper_type(gt)
    if num_feeders_available > 0
        desirability = P_gripper_type_wt[gt] +
                       (P_gripper_type_feeder_wt *
                        P_num_feeders_targeted[gt] /
                        num_feeders_available)
    else
      desirability = 0.0
    if num_pipettes_assigned[gt] >= P_num_pipettes_targeted[gt]
        desirability *= 0.1
desirability_of_pipette(gt,pip)
    if pip already assigned a gripper
        desirability = 0.0
    else if part needs to be aligned and even numbered pip and
    P_single_align desirability = 0.0
    else
        desirability = P_multi_wt * desire_multi(gt,pip) +
                       P_reachability_wt * desire_reachability+
                       P_fit_wt * desire_fit
desire_multi(gt,pip)
    if n_boards > 1
        examining the siblings of pip that can be used for
            multiplace:
            num_actual_multi = count of sibling pipettes with
            same gt
            num_potential_mult = count of sibling pipettes with
            no gt
            num_rivals = count of sibling pipettes with
            different gt
            num_rivals blocked = count of sibling pipettes with
            different gt
            that could use pip for multiplace
```

```
                desirability = [num_actual_multi +
                                P_multi_wt1 * num_potential_multi +
                                P_multi_wt2 * (num_rivals −
                                num_rivals_blocked)]
                              / (num_boards − 1)]
        else
                desirability = 1.0;
desire_reach(gt,pip)
        if pipette cannot reach board position of any of components
        of gt
                desirability = 0
        else
                desirability = num_pipettes to nearest neighbor of same
grip
        type / 27
desire_fit(gt,pip)
        desirability =
                1 −   num_feeders_available_to_pipette -
P_num_feeders_per_pipette[gt] /4
desirability_of_next_available_feeder(gt,pip)
        desirability = 0.5 *
                num_feeders_allocated[gt_of_1st_neighbor]/
                P_num_feeders_targeted[gt_of_1st_neighbor] +
                0.5 * num_feeders_allocated[gt_of_2nd_neighbor]/
                        P_num_feeders_targeted[gt_of_2nd_neighbor]
assign_components
        for each gripper type (gt)
                group_components(gt) onto tapes
                assign_tapes(gt) to feeders
group_components(gt)
        determine number of tapes to be allocated to each component
        type of same gt
        so that the largest number of any components on tape is
kept
        to a minimum and
                if P_use_all feeders[gt]
                so that all assigned feeders are used
assign_tapes(gt)
        if num_boards > 1
                do while there are unassigned tapes with parts grouped
by
                board and properly spaced available feeders
                        assign set of tapes with largest number of
components
        do while there are unassigned tapes and available feeders
        if P_packing_criterion[gt] is 0
                assign tape whose components are the most
constrained
                with regard to reachability (fewest number of pipettes can
                reach coordinates) else if P_packing_criterion[gt] is 1
                        assign tape with the greatest number of components
For the FCM:
/*** chromosome format:
                for each gripper type
                        3 bits PM weight [1/8-8/8]
                        1 bit PM preference bit
                        for each feeder type
                3 bits FT weight [1/8-8/8]
                        4 bits for sort option
                        4 bits for sort bits (ascending/descending)
                        1 bit for each part group for bucket selection
***/
```

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A method for optimizing configuration of a computer-controlled part pick-and-place machine for placing parts on a PCB, said machine comprising a support for the PCB, a plurality of gripping devices, a plurality of numbered feeders for holding parts for placing on the PCB, and means for activating the gripping devices to pick up selected parts from selected feeders and place them on selected positions on the PCB in accordance with one of a plurality of charges, each charge representing a specific set of parts which are picked and placed as a group and each group movement constituting one charge and a list of charges necessary to place on the parts on the PCB constituting a charge map capable of controlling operation of the machine, the method comprising the steps of:

(a) creating an initial population of chromosome strings each representing a set of parameters that control how a charge map is generated for controlling operation of the machine in order to place a given set of parts at given part locations on a given PCB, (b) providing a charge map generator, responsive to a given chromosome string, for generating the configuration and for computing a placement time for placing the given set of parts on the given PCB, with the machine in the configuration, (c) using a genetic algorithm to generate from the chromosome strings new chromosome strings, (d) evaluating the new chromosome strings generated in step (c) by supplying same to the charge map generator, (e) iterating steps (c) and (d) substituting those new chromosome strings for the chromosome strings if the new chromosome strings result in a lesser placement time than the chromosome strings, until a specified number of chromosome strings have been generated and evaluated or the chromosome population has been brought to convergence, and (f) outputting a best chromosome string found through iteration as representing a desired machine configuration.

2. The method of claim 1, further comprising the steps of:

(g) configuring the machine in accordance with the best chromosome string outputted in step (f), and (h) operating the machine to place the given set of parts on PCBs in accordance with the charge map generated in step (b) after the last iterating step.

3. The method of claim 1, wherein step (a) uses at least the following parameters represented in the chromosome string:

(ai) parameters for controlling priority of assigning gripper types and a number of feeders ideally associated with each gripper type, (aii) parameters for controlling assignment of pipette positions to gripper types by assigning the priority to the following criteria: reachability limitations, tightness of fit, multiplace opportunities, (aiii) parameters for controlling how feeders are allocated to pipettes by specifying an initial number of feeders per pipette position assigned per gripper type and for controlling in what order feeders are assigned, (aiv) parameters for controlling how parts are distributed over feeder positions by controlling how tightly parts are packed or how the distribution is permitted, (av) parameters for controlling which parts are assigned to which feeders by controlling the order that part types are assigned.

4. The method of claim 3, wherein each gripping device comprises a pipette and a gripper mounted on the pipette and the charge generator of step (b) uses the following steps to generate a charge map:

(i) until all feeder slots have been allocated:
choose a gripper type gt, based on ai
choose a pipette position pp for gt, based on aii
if pipette position pp available:
  allocate feeders reachable by pp, based on aiii
else
  allocate unused feeder for a pipette already assigned gt (ii) for each gripper type assigned:
determine how many feeders will be assigned to each part type, based on aiv
assign parts to specific feeders, based on av.

5. The method of claim 1, wherein the genetic algorithm used in step (c) is a genetic algorithm eliminating incestuous matings between parent chromosome strings, applying crossover to pairs of parent strings to create new offspring and employing survival of the fittest involving both parent and child chromosome strings, and applying population mutation only when the new chromosome strings converge after a limited number of iterations.

6. The method of claim 1, wherein each gripping device comprises a pipette and a gripper mounted on the pipette and the chromosome represents at least the following parameters:

a first weight for each gripper type, which weight influences the order in which gripper-to-pipette decisions are made;

a pipette preference bit for each gripper type, which pipette preference influences the gripper-to-pipette decisions when more than one pipette are equally desirable;

a second weight for each feeder type gripper type pair, which second weight influences the order of decisions on feeder types to feeder slots;

sort parameters for influencing an order in which the parts are considered when the parts are assigned to feeder slots and index step; and a preference bit for each part, which preference bit influences the choice of feeder location and index step.

7. A method for optimizing configuration of a computer-controlled part pick-and-place machine for placing parts on a PCB, said machine comprising a support for the PCB, a plurality of numbered pipettes exceeding six in number, a plurality of numbered grippers for different sized or shaped parts, each gripper being capable of being mounted on an associated pipette, a plurality of numbered feeders for holding the parts needed for populating the PCB, and means for activating the pipettes to move them, as a group, to pick up with their associated gripper selected parts from selected feeders and place the selected parts on selected positions on the PCB in accordance with one of a plurality of charges stored in the machine, each charge representing a specific set of parts which are picked as a group and each group movement constituting one charge and a list of charges necessary to place the parts a PCB constituting a charge map capable of controlling the operation of the machine, comprising the steps:

(a) creating an initial population of chromosome strings each represented by a plurality of bits and sets of bits, each chromosome string representing a set of parameters that control how a charge map is generated for controlling operation of the machine in order to place a given set of parts at given part locations on a given PCB, with a bit or set of bits in the chromosome string representing at least the following parameters:

i) parameters for controlling priority of assigning gripper types and a number of feeders ideally associated with each gripper type;

ii) parameters for controlling assignment of pipette positions to gripper types by assigning the priority to the following criteria: reachability limitations, tightness of fit, multiplace opportunities;

iii) parameters for controlling how feeders are allocated to pipettes by specifying an initial number of feeders per pipette position assigned per gripper type and for controlling in what order feeders are assigned;

(iv) parameters for controlling how parts are distributed over feeder positions by controlling how tightly parts are packed;

(v) parameters for controlling which parts are assigned to which feeders by controlling the order that part types are assigned;

(b) providing a charge map generator, responsive to a given chromosome string, for generating the configuration and for computing a placement time for placing the given set of parts on the given PCB, with the machine in the configuration, the charge map generator using the following steps to generate a charge map:

(i) until all feeder slots have been allocated:
choose a gripper type gt, based on ai
choose a pipette position pp for gt, based on aii if pipette position pp available:
allocate feeders reachable by pp, based on aiii
else
allocate unused feeder for a pipette already assigned gt (ii) for each gripper type assigned:
determine how many feeders will be assigned to each part type, based on aiv
assign parts to specific feeders, based on av.

8. A method for optimizing configuration of a computer-controlled part pick-and-place machine for placing parts on a PCB, said machine comprising a support for at least one PCB, at least one numbered pipette, a plurality of numbered grippers for different-sized or different-shaped parts, each gripper being capable of being mounted on an associated pipette, a plurality of numbered feeders for holding the parts for placing on the PCB, and means for activating the at least one pipette to pick up with the associated gripper selected parts from selected feeders and place the selected parts on selected positions on the PCB in accordance with a layout stored in the machine, comprising the steps of:

(a) creating a population of chromosome strings each represented by a plurality of bits and sets of bits, the chromosome strings representing a plurality of parameters for controlling a heuristic layout generator the chromosome string also representing one complete machine configuration to place given parts on a given PCB, (b) providing a heuristic layout generator which is capable, when supplied with a given chromosome string representing a given machine configuration, of computing a complete layout, and from the complete layout computing a placement time for populating a PCB with the machine in said given configuration, (c) using a genetic algorithm to generate chromosome strings representing possible solutions to the problem of determining a machine configuration to minimize placement time (d) iterating steps (b) and (c) until a chromosome string is generated representing a machine configuration which places the given parts on the given PCB in an acceptably short time.

9. The method of claim 8, wherein there are at least 3 pipettes and the parameters of step (a) include a target number of pipettes to be assigned to each gripper, which also influences the order of the gripper-to-pipette decisions.

10. The method of claim 8 wherein the genetic algorithm is CHC and comprises producing new offspring solutions from previously tested parent solutions
by crossing over some of the bits in their chromosomes,
eliminating incestuous matings between parents whose chromosomes are too similar,
employing survival of the fittest involving both parent and offspring chromosome strings, and
applying population mutation only when the generated solutions converge after a limited number of iterations.

11. The method of claim 8 wherein the chromosome string represents at least the following parameters:
a first weight for each gripper type, which first weight influences the order in which gripper-to-pipette decisions are made;
a pipette preference indication for each gripper type, which pipette preference indication influences the gripper-to-pipette decisions when more than one pipette are equally desirable;
a second weight for each feeder type for each gripper type, which second weight influences the order of decisions on feeder types to feeder slots;
sort parameters for influencing the order in which the parts are considered when assigning the parts to feeder slots and index step and
a preference indication for each part, which preference indication influences the choice of feeder location and index step.

12. A method for optimizing configuration of a computer-controlled part pick-and-place machine for placing parts on a PCB, said machine comprising a support for the PCB, a plurality of numbered pipettes exceeding six in number, a plurality of numbered grippers for different sized or shaped parts, each gripper being capable of being mounted on an associated pipette, a plurality of numbered feeders for holding the parts needed for populating the PCB, and means for activating the pipettes to pick up with their associated gripper selected parts from selected feeders and place them on selected positions on the PCB in accordance with a layout stored in the machine, comprising the steps of:

(a) creating a population of chromosome strings each represented by a plurality of bits and sets of bits, each chromosome string representing a layout for the machine, with a bit or set of bits in the chromosome string representing at least the following parameters: pipette number, feeder number, part number, gripper number assigned to pipette number, part number to be picked up by pipette at a particular time, and part numbers assigned to feeder numbers, the chromosome string also representing one complete machine configuration to a given set of parts on a given PCB, (b) providing a heuristic layout generator which is capable, when supplied with a given chromosome string representing a given machine configuration, of computing the placement time for populating a PCB with the machine in said given configuration, (c) using a genetic algorithm, CHC, to generate chromosome strings representing possible solutions to the problem of determining a machine configuration to minimize placement time, said genetic algorithm eliminating incestuous matings between parent and child chromosome strings, employing survival of the fittest involving both parent and child chromosome strings, and applying population mutation only when the generated solutions converge after a limited number of iterations, (d) testing solutions generated in step (c) by supplying same to the heuristic layout generator, (e) iterating steps (c) and (d) until a chromosome string is generated representing a machine configuration producing a desired shortened placement time.

13. A method for optimizing configuration of a computer-controlled part pick-and-place machine for populating a PCB, said machine comprising a support for a PCB, a plurality of pipettes, at least one gripping device for holding parts, a plurality of numbered feeders for holding the parts needed for populating the PCB, and means for activating the gripping device to pick up selected parts from selected feeders and place the selected parts on selected positions on the PCB in accordance with a digital specification, the method comprising the following steps:
   a) creating an initial population of chromosome strings, each representing a respective candidate digital specification;
   b) using a genetic algorithm to generate new chromosome strings;
   c) evaluating the new chromosome strings;
   d) repeating steps b) and c) until a stopping criterion is reached; and
   e) outputting the best chromosome string found after step d) as representing a desired machine configuration.

14. The method of claim 13 wherein each chromosome string comprises an indication of an allocation of the parts to the feeders.

15. The method of claim 13 wherein each gripping device comprises a pipette and a gripper and each chromosome string comprises an indication of an allocation of the grippers to the pipettes.

16. The method of claim 13 wherein each gripping device comprises a pipette and a gripper and each chromosome string comprises
   an indication of an allocation of the grippers to the pipettes; and
   an indication of an allocation of the parts to the feeders.

17. The method of claim 16 wherein the pick-and-place machine populates a family of PCBs and the digital specification corresponds to all of the PCBs, whereby the configuration indicates a single layout for the family.

18. The method of claim 13 wherein
   the pick-and-place machine includes a plurality of gripping devices;
   the digital specification includes a plurality of charges, each charge representing a specific set of parts which are picked and placed as a group, each group movement constituting one charge, and a list of charges necessary to place a given set of parts on a given PCB constitutes a charge map capable of controlling the operation of the machine; and
   each chromosome string includes an indication of a charge map.

19. The method of claim 13 wherein
   each chromosome string controls how a digital specification is generated; and
   the method further comprises the step of using a generator to generate the respective candidate digital specification from the chromosome string and compute the placement time for populating the PCB using the pick-and-place machine using the respective candidate digital specification; and
   the evaluating step includes supplying each chromosome string to the generator.

20. The method of claim 13 wherein
   the pick-and-place machine includes a plurality of gripping devices;
   each gripping device includes a pipette and a gripper;
   the digital specification includes a plurality of charges, each charge representing a specific set of parts which are picked and placed as a group, each group movement constituting one charge, and a list of charges necessary to place a given set of parts on a given PCB constitutes a charge map capable of controlling the operation of the machine;
   each chromosome string includes
      an indication of an allocation of grippers to pipettes;
      an indication of an allocation of parts to feeders; and
      an indication of a charge map.

21. The method of claim 13 wherein at least one gripping device makes a plurality of trips to the feeders to pick up parts and each chromosome string includes an indication of which parts to pick up on which trip.

* * * * *